(12) United States Patent
Kataoka et al.

(10) Patent No.: US 9,496,895 B2
(45) Date of Patent: Nov. 15, 2016

(54) COMPRESSION METHOD AND DECOMPRESSION METHOD

(71) Applicant: FUJITSU LIMITED, Kawasaki-shi, Kanagawa (JP)

(72) Inventors: Masahiro Kataoka, Tama (JP); Yasuhiro Suzuki, Yokohama (JP); Kohshi Yamamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/742,257

(22) Filed: Jun. 17, 2015

(65) Prior Publication Data

US 2015/0288383 A1    Oct. 8, 2015

Related U.S. Application Data

(63) Continuation of application No. PCT/JP2012/008138, filed on Dec. 19, 2012.

(51) Int. Cl.
*H03M 7/30* (2006.01)

(52) U.S. Cl.
CPC .......... *H03M 7/60* (2013.01); *H03M 7/3086* (2013.01)

(58) Field of Classification Search
CPC .. H03M 7/30; H03M 7/3084; H03M 7/3086; H03M 7/3088
USPC .................................................... 341/51, 87
See application file for complete search history.

(56) References Cited

U.S. PATENT DOCUMENTS

| 5,612,693 | A | 3/1997 | Craft et al. |
| 5,635,932 | A | 6/1997 | Shinagawa et al. |
| 5,748,122 | A | 5/1998 | Shinagawa et al. |
| 5,889,481 | A | 3/1999 | Okada |
| 6,307,488 | B1 * | 10/2001 | Cooper .................. G06T 9/005 341/51 |

(Continued)

FOREIGN PATENT DOCUMENTS

| JP | 3-209922 | 9/1991 |
| JP | 5-127865 | 5/1993 |

(Continued)

OTHER PUBLICATIONS

International Search Report mailed on Mar. 26, 2013 in corresponding International Patent Application No. PCT/JP2012/008138.

(Continued)

*Primary Examiner* — Khai M Nguyen
(74) *Attorney, Agent, or Firm* — Staas & Halsey LLP

(57) ABSTRACT

A method includes: first setting a first and a second storage regions; first comparing a compression target data in a file with data in the first storage region; first creating a first compression code of the compression target data based on the data in the first storage region when a predetermined first consistency between the compression target data and the data in the first storage region is detected; second comparing the compression target data with data in the second storage region when the predetermined first consistency between the compression target data and the data in the first storage region is not detected, the compression target data being moved to the second storage region after the second comparing; and first storing the compression target data into the first storage region when a predetermined second consistency between the compression target data and the data in the second storage region is detected.

13 Claims, 23 Drawing Sheets

(56) References Cited

U.S. PATENT DOCUMENTS

| | | | | |
|---|---|---|---|---|
| 6,426,711 B1 * | 7/2002 | Cooper | ............... | G06T 9/005 |
| | | | | 341/106 |
| 6,466,144 B1 * | 10/2002 | Cooper | ............ | H03M 7/3088 |
| | | | | 341/106 |
| 2002/0196166 A1 | 12/2002 | Satoh et al. | | |
| 2007/0096953 A1 | 5/2007 | Odagiri | | |

FOREIGN PATENT DOCUMENTS

| | | |
|---|---|---|
| JP | 5-233312 | 9/1993 |
| JP | 5-241777 | 9/1993 |
| JP | 6-28149 | 2/1994 |
| JP | 7-152533 | 6/1995 |
| JP | 8-32454 | 2/1996 |
| JP | 8-69476 | 3/1996 |
| JP | 8-116269 | 5/1996 |
| JP | 8-234959 | 9/1996 |
| JP | 9-218867 | 8/1997 |
| JP | 11-154872 | 6/1999 |
| JP | 2000-82967 | 3/2000 |
| JP | 2001-44850 | 2/2001 |
| JP | 2007-124561 | 5/2007 |

OTHER PUBLICATIONS

Written Opinion of the International Searching Authority mailed Mar. 26, 2013 in corresponding International Application No. PCT/JP2012/008138.

Araki et al., "LZSS Compression with a Token Dictionary," Institute of Electronics, Information and Communication Engineers, Technical Report, vol. 95, No. 593, pp. 49-52, Mar. 19, 1996, 6 Pages.

* cited by examiner

FIG. 4

| | | T1 |
|---|---|---|
| STORAGE REGION A1 (FILE F1) | START POSITION | P1 |
| | END POSITION | P2 |
| | READ POSITION | P3 |
| STORAGE REGION A2 | START POSITION | P4 |
| | END POSITION | P5 |
| | REFERENCE POSITION | P6 |
| | UPDATE POSITION | P7 |
| STORAGE REGION A3 | START POSITION | P8 |
| | END POSITION | P9 |
| | REFERENCE POSITION | P10 |
| | UPDATE POSITION | P11 |
| STORAGE REGION A4 (FILE F2) | START POSITION | P12 |
| | END POSITION | P13 |
| | WRITE POSITION | P14 |

COMPRESSION METHOD AND DECOMPRESSION METHOD

CROSS-REFERENCE TO RELATED APPLICATION

This application is a continuation application of International Application PCT/JP2012/008138 filed on Dec. 19, 2012 and designated the U.S., the entire contents of which are incorporated herein by reference.

FIELD

The embodiment discussed herein is related to a compression technology and a decompression technology for data.

BACKGROUND

A compression algorithm called LZ77 is known. LZ77 is adopted in compression file formats such as ZIP.

In LZ77, a compression process for data in a file is executed sequentially from the beginning of a compression target file. In LZ77, a data reference region (referred to as a slide window or the like) is set and data subjected to the compression process in the compression target file is stored sequentially in the slide window. The size of the slide window is set in advance. When the size of the data stored in the slide window exceeds the size of the slide window, the data is stored while the data stored beforehand in the slide window is updated.

In the compression process executed sequentially in LZ77, compressed codes are used which are generated based on a data string (longest matching data string) which matches longest piece of data to be executed in the compression process in the compression target file in the data included in the slide window. The compressed codes are information in which a matching length of the longest matching data string of the slide window and a position in the slide window are combined.

According to LZ77, as the matching length of the longest matching data string is longer, considerable data is expressed by one compressed code (a combination of the matching length and the position), thereby improving a compression ratio. When the longest matching data string of the matching length is considerably extracted from the compression target file, the compression ratio is improved. Therefore, there is a tendency to improve the compression ratio when the size of the slide window increases. This is because a probability of specifying the data string of which the matching length is long is improved since data matching processing target data is found from more data in the compression target file.

However, when the size of the slide window is enlarged to improve the compression ratio, the number of cross-checking of the processing target data and the data stored in the slide window increases. For this reason, a time taken to compress the compression target file increases.

As a technical document of the related art, there is Japanese Laid-open Patent Publication No. 5-241777.

SUMMARY

According to an aspect of the invention, a method includes: first setting a first storage region and a second storage region in a memory; first comparing a compression target data in a file with data in the first storage region; first creating a first compression code of the compression target data based on the data in the first storage region when a predetermined first consistency between the compression target data and the data in the first storage region is detected; second comparing the compression target data with data in the second storage region when the predetermined first consistency between the compression target data and the data in the first storage region is not detected, the compression target data being moved to the second storage region after the second comparing; and first storing the compression target data into the first storage region when a predetermined second consistency between the compression target data and the data in the second storage region is detected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating an example of a position information table T1;

DESCRIPTION OF EMBODIMENT

When the size of a slide window is enlarged to improve a compression ratio, the number of cross-checking of processing target data and data stored in the slide window increases. For this reason, a time taken to compress a compression target file increases.

According to an aspect of an embodiment, to reduce a processing time taken to execute compression is intended.

Hereinafter, an embodiment will be described.

Figure 1:
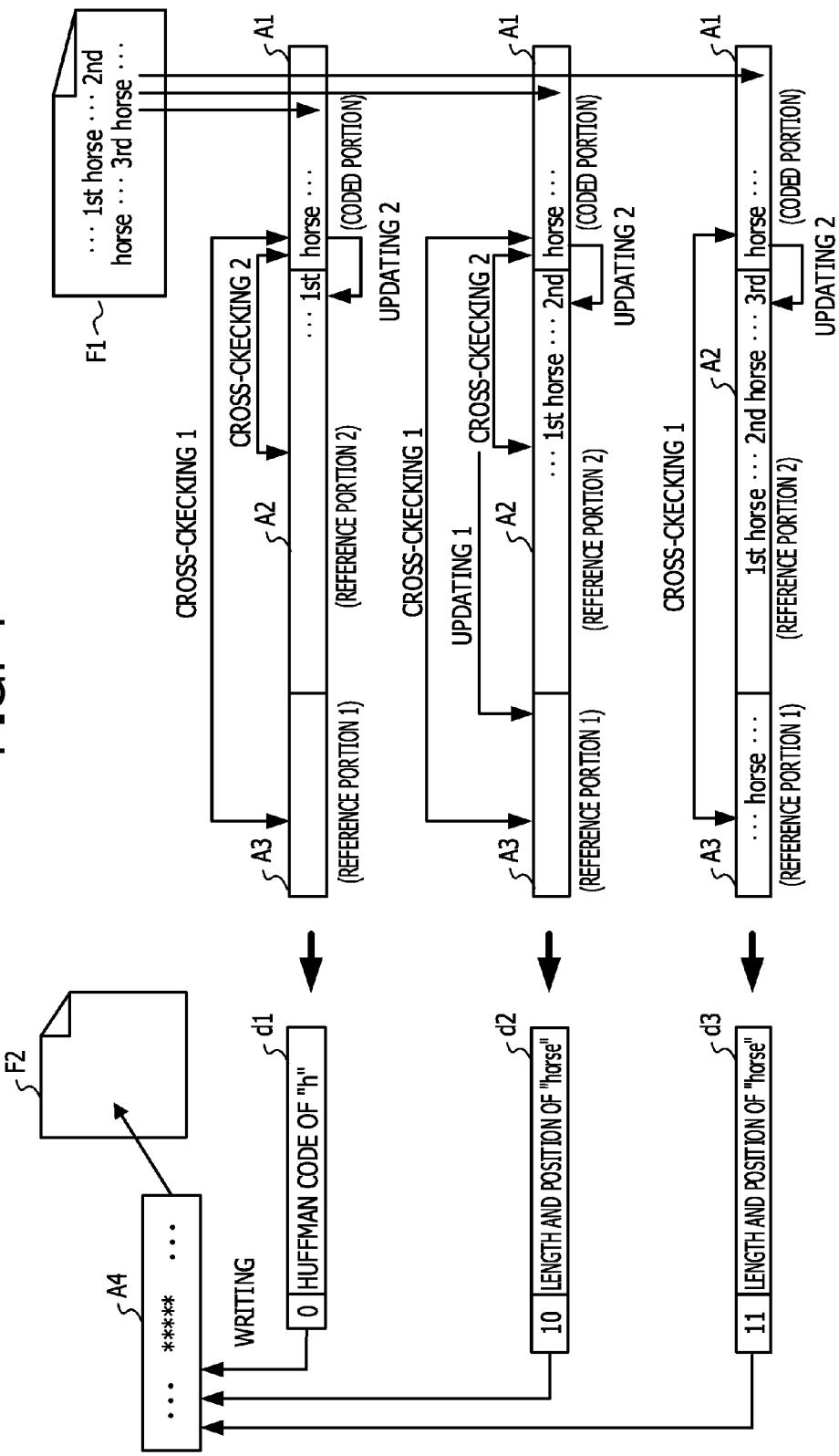
FIG. 1 is a diagram illustrating an example of the flow of a compression process.

FIG. 1 is a diagram illustrating an example of the flow of a compression process. As work areas for the compression process, a storage region A1, a storage region A2, and a storage region A3 are provided in a memory. Data is read sequentially from a compression target file F1 loaded to the storage region A1 and the read processing target data is converted sequentially into compressed data. The obtained compressed data is stored sequentially in the storage region A4 and a compressed file F2 is generated based on the compressed data stored in the storage region A4. In the compression process illustrated in FIG. 1, whenever processing target data is read from the file F1, at least one of generation of the compressed data according to a reference result of the storage region A3, updating to the storage region A3 according to a reference result of the storage region A2, and updating to the storage region A2 is executed.

As described above, the generation of the compressed data is executed based on a result of a reference process in the storage region A3 with respect to the processing target data in the storage region A1 and a result of a reference process to the storage region A2. A data string (longest matching data string) which matches the processing target data longest is extracted by cross-checking ("cross-checking 1" illustrated in FIG. 1) of the processing target data and a data string in the storage region A3. When the longest matching data string with a length equal to or greater than a predetermined length Lmin may be obtained by cross-checking 1, a compressed code is generated based on the length of the longest matching data string and the position of the longest matching data in the storage region A3. When the length of the longest matching data string by cross-checking 1 is shorter than the predetermined length Lmin, the longest matching data string is extracted by cross-checking ("cross-checking 2" illustrated in FIG. 1) of the processing target data and a data string in the storage region A2. When the longest matching data string obtained by cross-checking 2 has a matching length equal to or greater than the predetermined length Lmin, a compressed code is generated based on the length of the longest matching data string and the position of the longest matching data string in the storage region A2. When the matching length of the longest matching data string obtained by cross-checking 2 is shorter than the predetermined length Lmin, no compressed code is generated and Huffman coding is executed on the processing target data. Then, an obtained Huffman code becomes compressed data. In this case, the processing garget data may be used to set a compressed code without executing the Huffman coding. A compression process other than the compression process of the embodiment may be used. Information capable of determining a pre-decided method of generating the compressed data when the longest matching data string with a matching length equal to or greater than the predetermined length Lmin may not be obtained in either cross-checking 1 or cross-checking 2 is stored, for example, in the header of a compressed file.

The generated compressed code is written on the storage region A4 ("writing" illustrated in FIG. 1). The predetermined length Lmin is a length set as a threshold value indicating whether the compressed code is generated by the compression process of the embodiment and is equal to or greater than at least 1 byte. The predetermined length Lmin is set to 3 bytes according to, for example, the format of ZIP.

The compressed data includes an identifier indicating the form of a code. For example, when the longest matching data string with the matching length equal to or greater than the predetermined length Lmin may not be obtained in either cross-checking 1 or cross-checking 2, the compressed data includes an identifier (for example, "0") indicating the Huffman coding (or the processing target data itself) corresponding to the processing target data. For example, when the longest matching data length obtained by cross-checking 1 or cross-checking 2 exceeds the predetermined length Lmin, the compressed data includes an identifier (for example, "1") indicating a compressed code obtained using the compression process of the embodiment. In the compressed code including "1" in the identifier, for example, an identifier indicating the compressed code based on the longest matching data string obtained by cross-checking 1 is set to "11" and an identifier indicating the compressed code based on the longest matching data string obtained by cross-checking 2 is set to "10". For example, when the beginning of the compressed data includes the identifier and the beginning bit of the compressed data is "0", the compressed data is determined to be compressed data when the longest matching data string with the matching length equal to or greater than the predetermined length Lmin may not be obtained in either cross-checking 1 or cross-checking 2. When the beginning bit of the compressed data is "1", it is determined that the compressed code coded based on the longest matching data string is included. Further, a subsequent bit indicates the longest matching data string by cross-checking 1 or the longest matching data string by cross-checking 2. When the subsequent bit is "0", the compressed code is determined to be a compressed code based on the longest matching data string obtained by cross-checking 2. When the subsequent bit is "1", the compressed code is determined to be a compressed code based on the longest matching data string obtained by cross-checking 1.

The storage region A3 is updated based on the processing target data and data stored in the storage region A2. For example, the longest matching data string extracted by cross-checking 2 is stored in the storage region A3 ("updating 1" illustrated in FIG. 1).

The storage region A3 is, for example, a storage region in which a data size is decided. The data size is, for example, a size from about several kilobytes to about several tens of kilobytes. For example, when new data with a size equal to or greater than a given data size is stored, the new data is stored on old data stored in the beginning of the storage region A3. Further, logical beginnings are updated sequentially according to storage of data. The data stored in the storage region A3 is indicated by, for example, relative addresses from written positions of the beginnings slid according to storage of the data. The front and rear of a storage order between the data stored in the storage region A3 are indicated by the relative addresses from the written positions of the logical beginnings.

For example, updating 1 of the above-described storage region A3 may be configured to be executed when a compressed code corresponding to the processing target data is not generated because of the fact that the length of the longest matching data string is shorter than the predetermined length Lmin by cross-checking 1.

The storage region A2 is updated based on the processing target data read sequentially from the file F1. For example, the processing target data of the storage region A1 is written on the storage region A2 (updating 2). The storage region A2 is, for example, a storage region in which the data size is decided. The data size is, for example, a size from about several kilobytes to about several tens of kilobytes. For example, when new data with a size equal to or greater than a given data size is stored in the storage region A2, the new data is stored on old data stored in the beginning of the storage region A2.

For example, the above-described updating 2 may be executed when the storage region A3 is not updated because of the fact that the length of the longest matching data string is shorter than the predetermined length Lmin by cross-checking 2. Further, updating 2 may be executed when the matching length of one of the longest matching data string by cross-checking 1 and the longest matching data string by cross-checking 2 is shorter than the predetermined length Lmin.

In the example of the file F1 illustrated in FIG. 1, a character string " . . . 1st horse . . . 2nd horse . . . 3rd horse . . . " is included (" . . . " is an unspecified character string).

When a portion subsequent to "h" of "1st horse . . . " is the processing target data, the longest matching data string of "horse . . . " is retrieved in the storage region A3. As illustrated in FIG. 1, no data is stored in the storage region A3. Therefore, data matching "h" which is the beginning data is not present. That is, the length of the longest matching data string by cross-checking 1 is shorter than the predetermined length Lmin. The longest matching data string of "horse" is retrieved in the storage region A2. Since the data matching "h" is not included in the storage region A2 either, the length of the longest matching data string by cross-checking 2 is shorter than the predetermined length Lmin.

In the example of FIG. 1, when a portion subsequent to "h" of "1st horse . . . " is the processing target data, the longest matching data string with the matching length equal to or greater than the predetermined length Lmin may not be obtained in cross-checking 1 or cross-checking 2. Therefore, the Huffman coding of the beginning data "h" of the processing target data is executed. As described above, another compression process may be used instead of the Huffman coding or the character data "h" may be used without change. Compressed data d1 obtained based on the beginning data is written on the storage region A4.

Since the length of the longest matching data string by cross-checking 2 is shorter than the predetermined length, the updating (updating 1) of the storage region A3 is not executed. Since the longest matching data string with the matching length equal to or greater than the predetermined length Lmin may not be obtained by cross-checking 1 or cross-checking 2, the storage region A2 is updated (updating 2). In updating 2, the beginning data "h" of the processing target data is stored in the storage region A2.

Data of a subsequent processing target becomes "o . . . ". Even in the case of "orse . . . ", coding of the Huffman coding of "o" and storage of "o" on the storage region A2 are executed as in "horse . . . ".

When a portion after "h" of "2nd horse . . . " is the processing target data, the longest matching data string of "horse . . . " is retrieved in the storage region A3. As illustrated in FIG. 1, since no data is stored in the storage region A3, data matching "h" which is the beginning data is not present. That is, the length of the longest matching data string by cross-checking 1 is shorter than the predetermined length Lmin.

The longest matching data string of "horse . . . " is retrieved in the storage region A2 (cross-checking 2). Here, " . . . 1st horse . . . " is already stored in the storage region A2. For example, "h" is first retrieved in the storage region A2. Then, whether "o", "r", "s", and "e" are contiguous from the portion of "h" obtained through the retrieving in the storage region A2 is combined sequentially. In the example of FIG. 1, the processing target data "horse . . . " matches "horse" of " . . . 1st horse . . . " in the storage region A2. When the matching "horse" is the longest matching data string and the matching length is equal to or greater than the predetermined length Lmin, the compressed code is generated based on the address and the matching length of the longest matching data string "horse" in the storage region A2. The compressed data d2 including the generated compressed code is stored in the storage region A4.

Since the matching length of the longest matching data string obtained by cross-checking 2 is equal to or greater than the predetermined length Lmin, the updating of the storage region A3 is executed based on the longest matching data string (updating 1). That is, the longest matching data string "horse" is stored in the storage region A3.

When a portion after "h" of 3rd horse . . . " is the processing target data, the longest matching data string of "horse . . . " is retrieved in the storage region A3 (cross-checking 1). As illustrated in FIG. 1, "horse" is already stored in the storage region A3. For example, "h" is first retrieved in the storage region A3. Then, whether "o", "r", "s", and "e" are contiguous from the portion of "h" obtained through the retrieving in the storage region A3 is combined sequentially. In the example of FIG. 1, the data string "horse" matches by cross-checking 1. When the matching "horse" is the longest matching data string and the matching length is equal to or greater than the predetermined length Lmin, the compressed code is generated based on the address and the matching length of the longest matching data string "horse" in the storage region A3. The compressed data d3 including the generated compressed code is stored in the storage region A4.

Since the matching length of the longest matching data string obtained by cross-checking 1 is equal to or greater than the predetermined length Lmin, for example, a process is executed on subsequent data without executing cross-checking 2, updating 1, and updating 2. Of cross-checking 2, updating 1, and updating 2, only updating 2 may be configured to be executed.

Through the compression process illustrated in FIG. 1, the data string appearing a plurality of times in the file F1 is stored in the storage region A3. That is, the compressed code is generated according to a result obtained by reference to the storage region A3 in which the data string appearing the plurality of times in the file F1 is stored. When the same data is frequently used in the file F1, there is a high possibility of the data stored in the storage region A3 being the data frequently used in the file F1. That is, by the cross-checking with the data stored in the storage region A3, there is a high possibility of the matching data being also found by the slide window of normal LZ77. The longest matching data string in the storage region A2 is stored in the storage region A3.

Therefore, when the length of the data repeated in the file F1 is long, there is a high probability of the data string with a long data length being extracted as the longest matching data string even in the storage region A3. Thus, the characteristics of the compression using the longest matching data string are maintained. Therefore, since a compression ratio is maintained even when the size of the storage region A3 is reduced further than the slide window used in LZ77 and the size of the data combined with the processing target data is small, a compression speed is expected to be improved.

A compression process is executed by reading data once in the file F1. Therefore, access to a memory in which each storage region is provided is suppressed further than when a compression dictionary is generated and a compression process is then executed based on the compression dictionary. Further, when the storage region A2 is assumed to be updated at a time at which the storage region A3 is not updated, the number of times the storage region A2 is updated is suppressed.

As a modification example of the example of FIG. 1, even when the longest matching data string with a length equal to or greater than the predetermined length Lmin is present in the storage region A2, compressed data including a Huffman code may be generated. In the example of FIG. 1, when a portion subsequent to "h" of " . . . 2nd horse . . . " is the processing target data, the longest matching data string with the length equal to or greater than the predetermined length Lmin has not been obtained in cross-checking 1 and the longest matching data string with the length equal to or greater than the predetermined length Lmin may be obtained by cross-checking 2, as described above. In this case, for example, compressed data of the identifier "0" including the Huffman code of "h" is generated without using the longest matching data string "horse" in the storage region A2. Even in this case, the updating process (updating 1) for the storage region A3 based on the longest matching data string "horse" is executed. Then, when subsequent processing target data is "horse . . . ", a compressed code by cross-checking (cross-checking 1) of the storage region A3 is generated. In this modification example, since the compressed code generated by the cross-checking of the storage region A2 is not used, an identifier assigned to the compressed code generated by the cross-checking of the storage region A3 may be set to "1". This is because it is possible to determine which storage region is good to be referred to in order to execute decoding even without executing determination at the second bit such as "10" or "11". In this modification example, when the same data string appears at the second time, a compressed code based on the longest matching data string is not generated, but a compressed code based on the longest matching data string is generated after the third time. On the other hand, as described above, the identifier is expressed with 1 bit to determine a decompression method.

Figure 2:
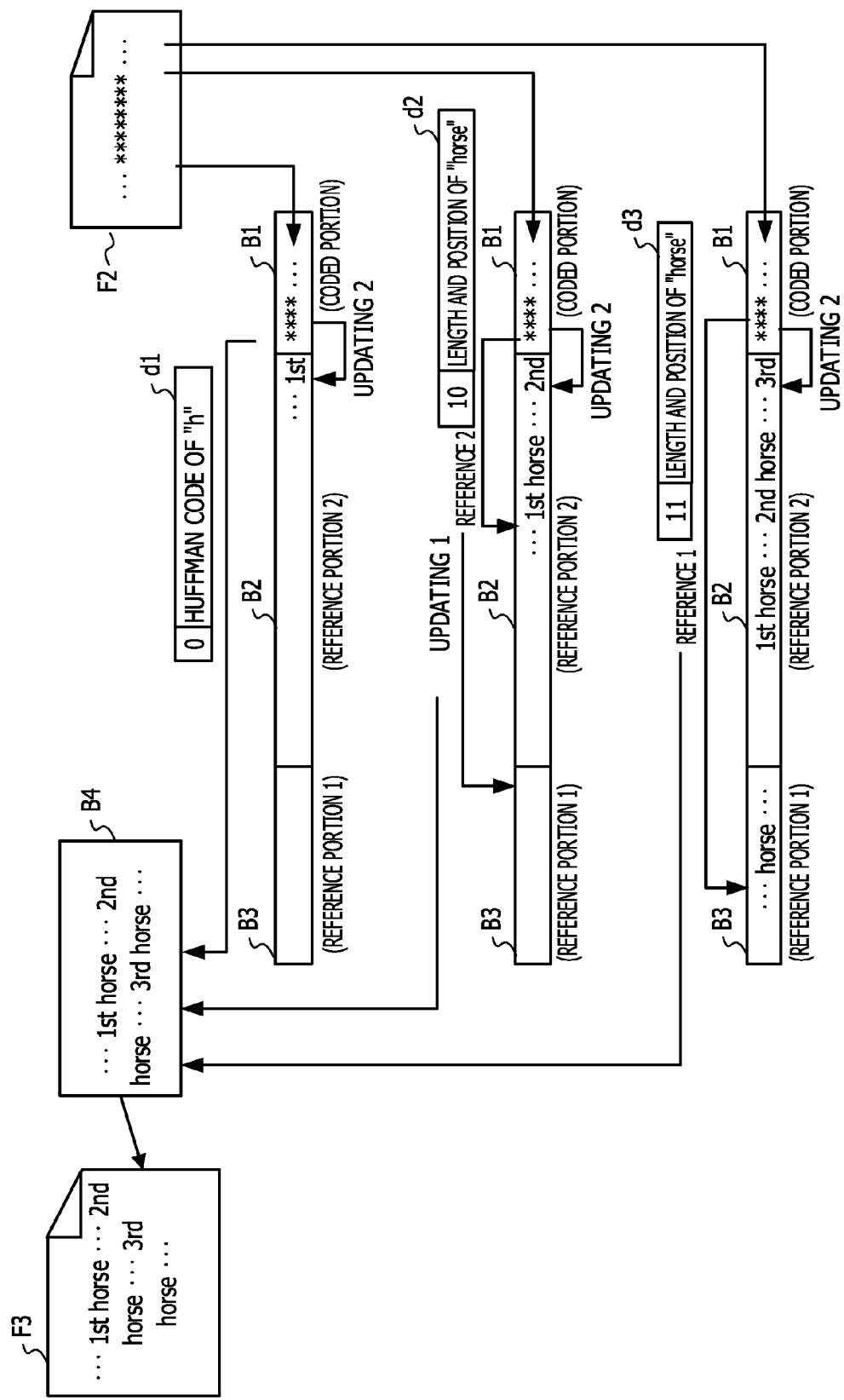
FIG. 2 is a diagram illustrating the flow of a decompression process.

FIG. 2 is a diagram illustrating the flow of a decompression process. As work areas of the decompression process, a storage region B1, a storage region B2, and a storage region B3 are provided in a memory. The compressed data is read sequentially from the compressed file F2 which is a decompression target loaded to the storage region B1, and then the read processing target compressed data is converted sequentially into decompressed data. As described above, the compressed data included in the compressed file F2 is the compressed code by the compression process of the embodiment or the compressed code (or processing target data) by a compression process such as the Huffman coding other than the embodiment. The obtained compressed data is stored sequentially in the storage region B4 and a decompressed file F3 is generated based on the decompressed data stored in the storage region B4. In the decompression process illustrated in FIG. 2, at least one of generation of the decompressed data, updating to the storage region B3 according to a reference result of the storage region B2, and updating to the storage region B2 is executed whenever the processing target compressed data is read from the file F2.

When the processing target compressed data is the compressed code By the compression process of the embodiment (for example, the identifier is "10" or "11"), the decompressed data is generated using the data stored in the storage region B2 or the storage region B3. When the compressed data is the compressed code by a compression process such as the Huffman coding other than the embodiment (for example, the identifier is "0"), the decompressed data is generated according to the compression process. Whether the compressed data is the compressed code by the compression process of the embodiment is determined based on the identifier assigned to the compressed data.

For example, when the identifier of the processing target compressed data is "11", data is acquired from the storage region B3 based on the position and the matching length of the longest matching data string included in the compressed code. The acquired data is present at a position indicated in the compressed code in the storage region B3 and is data with the matching length indicated in the compressed code. The acquired data is decompressed data. When the identifier of the processing target compressed data is "10", data which is present at a position indicated in the compressed code in the storage region B2 and has a length indicated in the compressed code is acquired. The acquired data is decompressed data. When the identifier of the processing target compressed data is "0", the decompressed data is generated based on the compressed data. When the compressed data is the compressed code by a compression process other than the embodiment, the decompressed data is acquired by a decompression process corresponding to the compression process. When the compressed code is not the original compressed code, the acquired data is decompressed data.

The storage region B2 and the storage region B3 are frequently updated according to the decompression of each piece of compressed data. When the identifier included in the compressed data is "0", the updating process (updating 1) for the storage region B3 is not executed and the updating process (updating 2) for the storage region B2 is executed. When the identifier included in the compressed data is "10", the updating process (updating 2) for the storage region B2 is not executed and the updating process (updating 1) for the storage region B3 is executed. When updating 2 is decided to be executed according to the generation of the compressed code in which the identifier "10" is assigned in the compression process of FIG. 1, updating 2 is also executed according to the decompression of the compressed data to which the identifier "10" is assigned even at the time of the decompression process. When the identifier included in the compressed data is "11", either the updating process (updating 2) for the storage region B2 or the updating process (updating 1) for the storage region B3 is not executed. When updating 2 is decided to be executed according to the generation of the compressed code in which the identifier "11 is assigned in the compression process of FIG. 1, updating 2 is executed according to the decompression of the compressed data to which the identifier "11" is assigned even at the time of the decompression process.

The storage region B3 is, for example, a storage region in which a data size is decided. The data size is, for example, a size from about several kilobytes to about several tens of kilobytes. For example, when new data with a size equal to or greater than a given data size is stored in the storage region B3, the new data is stored on old data stored in the beginning of the storage region B3. Logical beginnings are updated sequentially according to the storage of the data. The data stored in the storage region B3 is indicated by, for example, relative addresses from written positions of the sequentially updated beginnings. The front and rear of a storage order between the data stored in the storage region B3 are indicated by the relative addresses from the written positions of the logical beginnings.

The storage region B2 is also, for example, a storage region in which a data size is decided like the storage region B3. The data size is, for example, a size from about several kilobytes to about several tens of kilobytes. For example, when new data with a size equal to or greater than a given data size is stored in the storage region B2, the new data is stored on old data stored in the beginning of the storage region B2. Logical beginnings are updated sequentially according to the storage of the data. The data stored in the storage region B2 is indicated by, for example, relative addresses from written positions of the sequentially updated beginnings. The front and rear of a storage order between the data stored in the storage region B2 are indicated by the relative addresses from the written positions of the logical beginnings.

In FIG. 2, examples of the decompression process for the compressed data d1, the compressed data d2, and the compressed data d3 exemplified in FIG. 1 are illustrated. The decompressed data included in the compressed file F2 is decompressed in order according to the identifiers included in the compressed data.

In reading of the compressed data d1, it is first confirmed that the identifier is "0". When the compressed data d1 is generated using the Huffman coding, the decompressed data "h" is generated in a decoding order based on the Huffman coding. When the compressed data d1 includes the data "h", the data "h" is assumed to be decompressed data. When the identifier is "0", updating (updating 2 illustrated in FIG. 2) to the storage region B2 is executed. In updating 2, the decompressed data "h" is stored in the storage region B2.

In reading of the compressed data d2, it is first confirmed that the identifier is "10". When the identifier is "10", the storage region B2 is referred to based on the compressed code in the compressed data d2 (reference 2 illustrated in FIG. 2). In the example of FIG. 2, the data with the matching length indicated in the compressed code is "horse" from the position indicated in the compressed code in the storage region B2. Since the storage region B2 is updated (updating 2 illustrated in FIG. 2) based on the compressed data read earlier than the compressed data d2 and the same state as the storage region A2 at the time of the generation of the compressed data d2 in the example of FIG. 1 is achieved, the same data "horse" is acquired by the designation of the position and the length. When the identifier is "10", the updating to the storage region B3 (updating 1 illustrated in FIG. 2) is executed. In updating 1, the decompressed data "horse" is stored in the storage region B3. When the identifier is "10", whether updating 2 is executed is changed according to setting. When the updating of the storage region A2 (updating 2 illustrated in FIG. 1) is executed at the time of the generation of the compressed data of the identifier "10" in the compression process, the updating of the storage region B2 (updating 2 illustrated in FIG. 2) is executed even in the decompression process.

In reading of the compressed data d3, it is first confirmed that the identifier is "11". When the identifier is "11", the storage region B3 is referred to based on the compressed code in the compressed data d3 (reference 1 illustrated in FIG. 2). In the example of FIG. 2, the data with the matching length indicated in the compressed code is "horse" from the position indicated in the compressed code in the storage region B3. Since the storage region B3 is updated (updating 1 illustrated in FIG. 2) based on the compressed data read earlier than the compressed data d3 and the same state as the storage region A3 at the time of the generation of the compressed data d3 in the example of FIG. 1 is achieved, the same data "horse" is acquired by the designation of the position and the length. When the identifier is "11", the updating to updating 1 and updating 2 is executed is executed according to setting. When the updating of the storage region A2 (updating 2 illustrated in FIG. 1) is executed at the time of the generation of the compressed data of the identifier "11" in the compression process, updating is also executed in the decompression process according to the updating executed at the time of the generation of the compressed data. In the decompression process illustrated in FIG. 2, the updating of the storage region B3 is executed when the compressed data is the compressed code by a compression process other than the embodiment (or the compressed data is processing target data). Therefore, by suppressing the number of updates without executing the updating of the slide window for each decompression process for the compressed data, such as LZ77, an increase in a decompression speed may be achieved.

In the modification example of the compression process described in FIG. 1, the two identifiers "0" and "1" are used and the compressed code indicating the data in the storage region A2 is not used. In a decompression process corresponding to that of the modification example, decompressed data is generated from the compressed data of the identifier "0", the decompressed data is stored in the storage region B2 (updating 2), and the decompressed data and the data in the storage region B2 are combined. When the longest matching data string matching the decompressed data with a length equal to or greater than the predetermined length Lmin is present in the storage region B2 as the result of the cross-checking, the longest matching data string is stored in the storage region B3 (updating 1). Thus, the storage region B3 enters the same state as the storage region A3.

Figure 3:
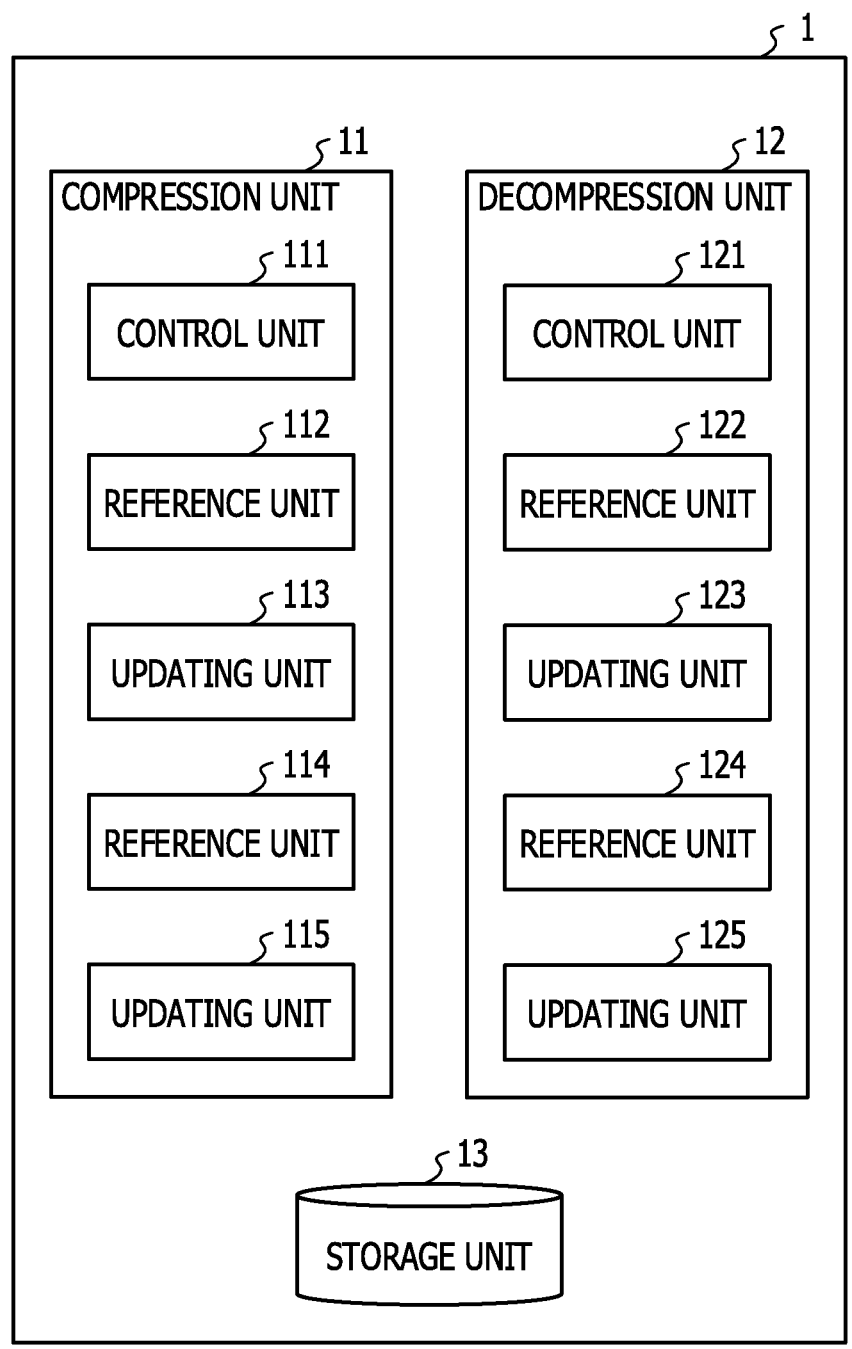
FIG. 3 is a diagram illustrating an example of a functional configuration.

FIG. 3 is a diagram illustrating an example of a functional configuration. A computer 1 executing the process of the embodiment includes a storage unit 13 and at least one of a compression unit 11 and a decompression unit 12. The compression unit 11 executes a compression process and the decompression unit 12 executes a decompression process. The storage unit 13 stores, for example, a compression target file F1, a file F2 obtained through the compression process, and a file F3 obtained by decompressing the file F2. The storage unit 13 is used as a work area of the compression unit 11 or the decompression unit 12. The compression unit 11 includes a control unit 111, a reference unit 112, an updating unit 113, a reference unit 114, and an updating unit 115. The decompression unit 12 includes a control unit 121, a reference unit 122, an updating unit 123, a reference unit 124, and an updating unit 125.

The control unit 111 realizes a compression function by controlling the reference unit 112, the updating unit 113, the reference unit 114, and the updating unit 115. To retain data used for a process of each functional unit, the control unit 111 reserves storage regions (for example, the storage region A1, the storage region A2, the storage region A3, and the storage region A4 described above) in the storage unit 13. The reference unit 112 executes a reference process for data in the storage region A2 based on a data string at a read position in the storage region A1. The updating unit 113 updates the data in the storage region A2 according to reading of the data string at the read position in the storage region A1. The reference unit 114 executes a reference process for the storage region A3 illustrated in FIG. 1 based on the data string at the read position in the storage region A1. The control unit 111 generates compressed data according to a reference result in the storage region A3 by the reference unit 114. The updating unit 115 updates the storage region A3 according to a reference result of the storage region A2 by the reference unit 112. An execution order of the process by each functional unit in the compression unit 11 will be described below.

The control unit 121 realizes a decompression function by controlling the reference unit 122, the updating unit 123, the reference unit 124, and the updating unit 125. To retain data used for a process of each functional unit, the control unit 121 reserves storage regions (for example, the storage region B1, the storage region B2, the storage region B3, and the storage region B4 described above) in the storage unit 13. The reference unit 122 executes a reference process for data in the storage region B2 based on the compressed data at a read position in the storage region B1. The updating unit 123 updates the data in the storage region B2 according to the compressed data at the read position in the storage region B1. The reference unit 124 executes a reference process for the storage region B3 illustrated in FIG. 2 based on a data string at the read position in the storage region B1. The updating unit 125 updates the storage region B3 according to a reference result of the storage region B2 by the reference unit 122. An execution order of the process by each functional unit in the decompression unit 12 will be described below.

FIG. 4 is a diagram illustrating an example of a position information table T1 used to manage position information of the storage regions. The position information table T1 is used to manage the position of each storage region (the storage region A1, the storage region A2, the storage region A3, the storage region A4, and the like) in the storage unit 13 used for the compression process. The position information table T1 includes a start position P1, an end position P2, and a read position P3 of the storage region A1 to which the file F1 is loaded. The position information table T1 includes a start position P4, an end position P5, a reference position P6, and an update position P7 of the storage region A2. The position information table T1 includes a start position P8, an end position P9, a reference position P10, and an update position P11 of the storage region A3. The position information table T1 includes a start position P12, an end position P13, and a write position P14 of the storage region A4 provided for generating the file F2. An initial value of each piece of position information stored in the position information table T1 is set by the control unit 111. The start position and the end position of each storage region indicate a storage start position and end position of data to be compressed or decompressed. Since a header or the like is excluded, for example, the initial value of the read position P3 is the same as the start position P1. The initial values of the reference position P6 and the update position P7 are also the same as the start position P4. The initial values of the reference position P10 and the update position P11 are also the same as the start position P8 and the write position P14 is also the same as the start position P12.

Figure 5:
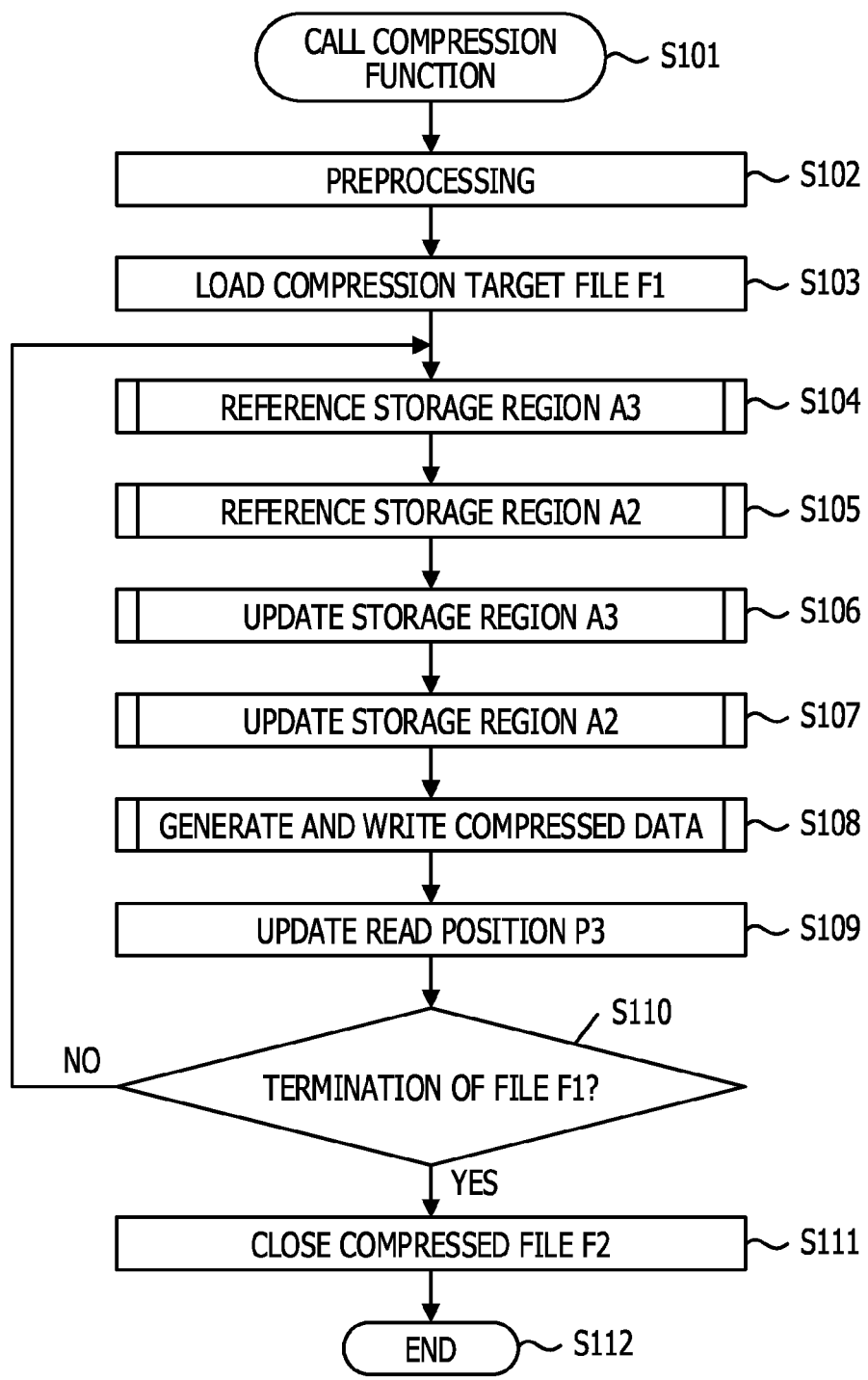
FIG. 5 is an exemplary whole flowchart illustrating a compression process.

FIG. 5 is a flowchart illustrating an order example of the compression process. When the compression function is first called through an operation of an operating system or an application program in the computer 1 (S101), the control unit 111 executes preprocessing (S102). The preprocessing of S102 is, for example, reservation of the storage region A1, the storage region A2, and the storage region A3 illustrated in FIG. 1, reservation of the storage region A4 in which compressed data is stored, and setting of each piece of position information (for example, each piece of position information illustrated in FIG. 4) in each storage region.

When the process of S102 ends, the control unit 111 loads the compression target file F1 to the storage region A1 (S103). The control unit 111 sets the end position P2 based on termination of the file F1. Next, the control unit 111 causes the reference unit 114 to execute the reference process for the storage region A3 (S104).

Figure 6:
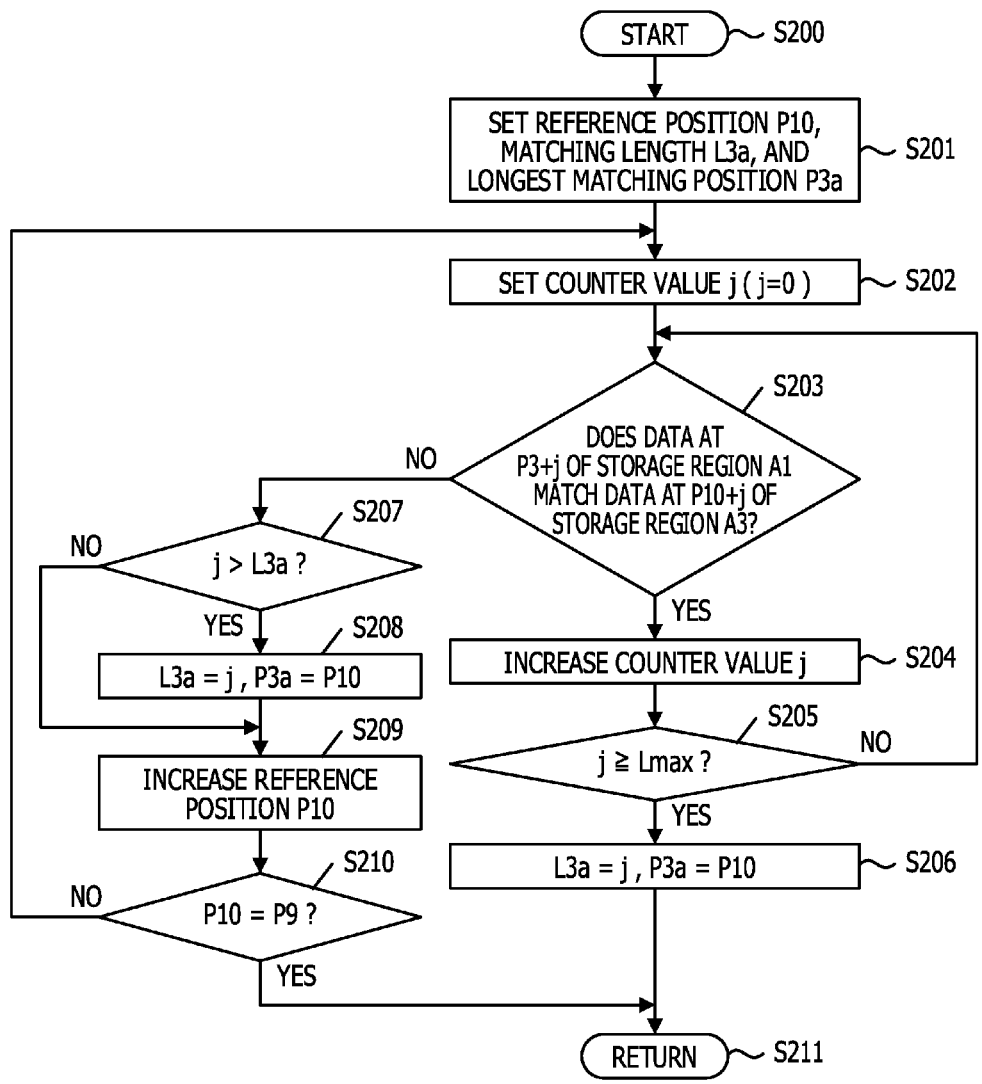
FIG. 6 is an exemplary flowchart illustrating a reference process for a storage region A3.

FIG. 6 is an exemplary flowchart illustrating a reference process for a storage region A3. When an instruction of reference process is received in the control unit 111 (S200), the reference unit 114 sets the reference position P10, the matching length L3a, and a longest matching position P3a (S201). The reference position P10 and the longest matching position P3a are set to be the same as the start position P8 or the same as the update position P11. The matching length L3a is set to, for example, "0". The reference unit 114 further sets a counter value j to an initial value (for example, j=0) (S202).

The reference unit 114 determines whether unit data in the storage region A1 matches unit data in the storage region A3 (S203). In this determination, it is determined whether the unit data at a position (P3+j) moving by the counter value j from the read position P3 of the storage region A1 matches the unit data at a position (P10+j) moving by the counter value j from the reference position P10 of the storage region A3. The unit data is, for example, information regarding units of characters or the like. In the embodiment, the unit data is a unit amount expressing the counter value j, the reference position P10, or the like and is expressed by a data amount such as an increment such as an increment of the counter value j or the reference position P10.

When the unit data at the position (P3+j) matches the unit data at the position (P10+j) (Yes in S203), the reference unit 114 increases the counter value j (S204). The reference unit 114 further determines whether the counter value j is equal to or greater than a predetermined length Lmax (S205). The predetermined length Lmax is the maximum value set for the matching length L3a handled in the compression process of the embodiment. In the embodiment, since the increment of the counter value j is a unit amount (a data amount of the unit data) for length expression of the predetermined length Lmax, it may be determined in the process of S205 whether the counter value j is "the same" as the predetermined length Lmax. When the matching determination is executed for every plurality pieces of unit data rather than the matching determination of S203 between the unit data and an increment of an amount according to the matching determination is executed in S204, the counter value j may be greater than the predetermined length Lmax. In this case, it may be determined in S205 whether the counter value j is "equal to or greater than" the predetermined length Lmax. The same applies to a comparison process with the predetermined length Lmax to be described below. When the data amount to be increased is the unit amount of the length expression, whether the counter value j is "the same as" the predetermined length Lmax is determined. When the data amount to be increased is greater than the unit amount of the length expression, whether the counter value j is "equal to or greater than" the predetermined length Lmax is determined. When the counter value j is "equal to or greater than" the predetermined length Lmax (Yes in S205), the reference unit 114 substitutes the counter value j to the matching length L3a and substitutes the value of the reference position P10 to the longest matching position P3a (S206). Here, "=" of "L3a=j and P3a=P10" expressed in the process of S206 in FIG. 6 indicates a substitution operator. When the counter value j is not equal to or greater than the predetermined length Lmax (No in S205), the reference unit 114 executes the determination of S203 again. S205 and S206 are an additional order. When S204 is executed, the determination of S203 may be necessarily executed.

When the unit data at the position (P3+j) does not match the unit data at the position (P10+j) (No in S203), the reference unit 114 determines whether the counter value j is greater than the matching length L3a (S207). When the counter value j is greater than the matching length L3a (Yes in S207), the reference unit 114 substitutes the counter value j to the matching length L3a and substitutes the value of the reference position P10 to the longest matching position P3a (S208). When the counter value j is equal to or less than the matching length L3a (No in S207) and the process of S208 is executed, the reference unit 114 increases the reference position P10 (S209).

The reference unit 114 determines whether the reference position P10 increased in S209 reaches the end position P9 (S210).

Here, "=" of "P10=P9" expressed in the process of S210 in FIG. 6 indicates an equal sign. When the reference position P10 does not reach the end position P9 (No in S210), the reference unit 114 executes the process of S202 again. When the reference position P10 is set to the start position P8 in S201, the above-described process is executed. However, when the reference position P10 is set to the update position P11, it is determined in S210 whether the reference position P10 reaches the update position P11. When the reference position P10 is initially set to the update position P11 and when the reference position P10 reaches the end position P9, the reference position P10 returns to the start position P8 through the process of S209.

When the reference position P10 reaches the end position P9 (Yes in S210) and the process of S206 is executed, the reference unit 114 returns the longest matching position P3a and the matching length L3a to the control unit 111 and ends the reference process for the storage region A3 (S211).

When the reference result by the reference unit 114 returns to the control unit 111, the control unit 111 causes the reference unit 112 to execute the reference process for the storage region A2 (S105).

Figure 7:
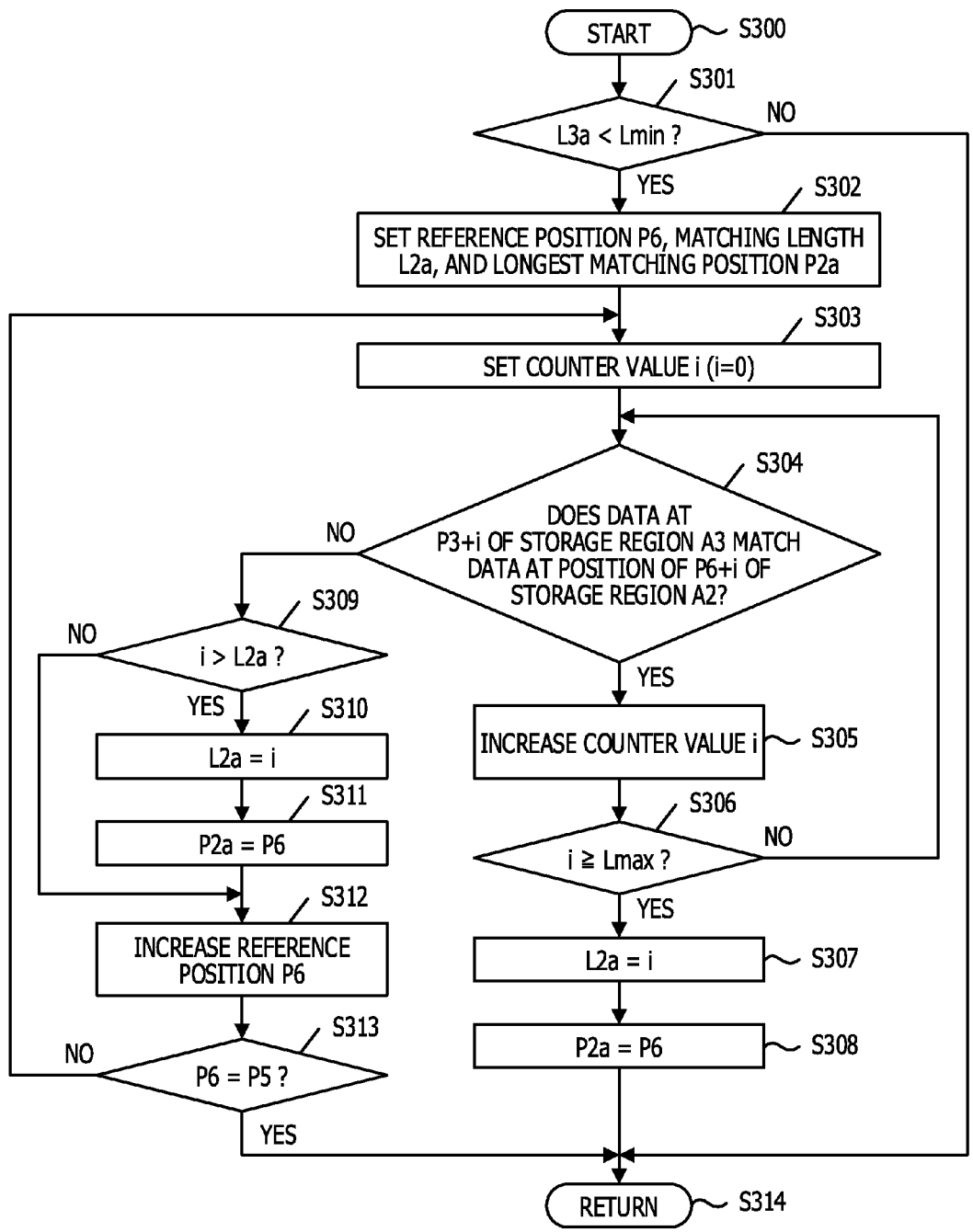
FIG. 7 is an exemplary flowchart illustrating a reference process for a storage region A2.

FIG. 7 is an exemplary flowchart illustrating the reference process for the storage region A2. When an instruction to refer to the storage region A2 is given by the control unit 111 (S300), the reference unit 112 determines whether the matching length L3a obtained through the process of the reference unit 114 is shorter than the predetermined length Lmin (S301). When the matching length L3a is equal to or greater than the predetermined length Lmin (No in S301), the reference unit 112 ends the process (S314).

When the matching length L3a is shorter than the predetermined length Lmin (Yes in S301), the reference unit 112 sets the reference position P6, the matching length L2a, and the longest matching position P2a (S302). The reference position P6 and the longest matching position P2a are set to be the same as the start position P4 or the same as the update position P7. The matching length L2a is set to, for example, "0". The reference unit 112 further sets a counter value i to an initial value (for example, i=0) (S303).

The reference unit 112 determines whether the unit data in the storage region A1 matches the unit data in the storage region A2 (S304). In this determination, it is determined whether the unit data at a position (P3+i) moved by the counter value i from the read position P3 of the storage region A1 matches the unit data at a position (P6+i) moved by the counter value i from the reference position P6 of the storage region A2.

When the unit data at the position (P3+i) matches the unit data at the position (P6+i) (Yes in S304), the reference unit 112 increases the counter value i (S305). The reference unit 112 further determines whether the counter value i is equal to or greater than a predetermined length Lmax (S306). The predetermined length Lmax may be the same as or different from the predetermined length Lmax in FIG. 6. When the counter value i is equal to or greater than the predetermined length Lmax (Yes in S306), the reference unit 112 substitutes the counter value i to the matching length L2a (S307) and substitutes the value of the reference position P6 to the longest matching position P2a (S308). Here, "=" of expressed in the processes of S307 and S308 in FIG. 7 indicates a substitution operator. When the counter value i is not equal to or greater than the predetermined length Lmax (No in S306), the reference unit 112 executes the determination of S304 again. S306 to S308 are an additional order. When S305 is executed, the determination of S304 may be necessarily executed.

When the unit data at the position (P3+i) does not match the unit data at the position (P6+i) (No in S304), the reference unit 112 determines whether the counter value i is greater than the matching length L2a (S309). When the counter value i is greater than the matching length L2a (Yes in S309), the reference unit 112 substitutes the counter value i to the matching length L2a (S310) and substitutes the value of the reference position P6 to the longest matching position P2a (S311). When the counter value i is equal to or less than the matching length L2a (No in S309) and the process of S311 is executed, the reference unit 112 increases the reference position P6 (S312).

The reference unit 112 determines whether the increased reference position P6 increased in S312 is the end position P5 (S313). When the reference position P6 is set to the start position P4 in S302, the above-described process is executed. However, when the reference position P6 is set to the update position P7, it is determined in S313 whether the reference position P6 is the update position P7. When the reference position P6 is initially set to the update position P7 and when the reference position P6 is the end position P5, the reference position P6 returns to the start position P4 through the process of S312. Here, "=" of "P6=P5" expressed in the process of S313 in FIG. 7 indicates an equal sign. When the reference position P6 is not the end position P5 (No in S313), the reference unit 112 executes the process of S303 again.

When the reference position P6 is the end position P5 (Yes in S313) and the process of S308 is executed, the reference unit 112 returns the longest matching position P2a and the matching length L2a to the control unit 111 and ends the reference process for the storage region A2 (S314).

Next, the control unit 111 causes the updating unit 115 to execute the updating process to the storage region A3 based on the result (the matching length L2a and the longest matching position P2a) of the reference process to the storage region A2 of S105 (S106).

Figure 8:
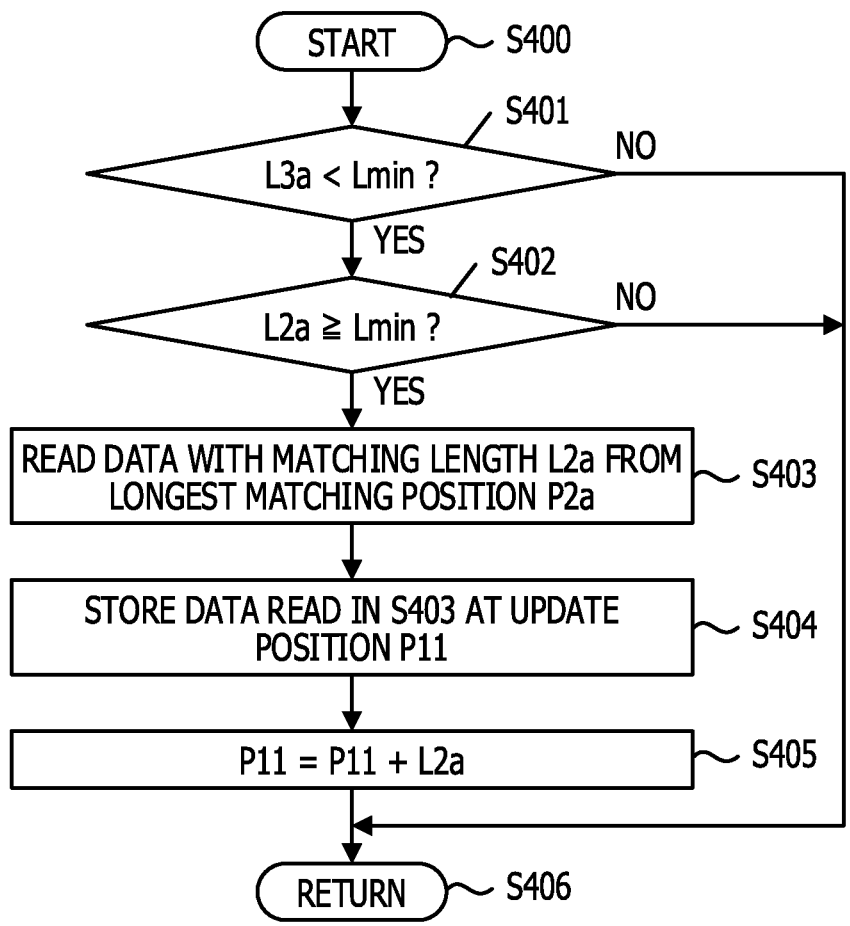
FIG. 8 is an exemplary flowchart illustrating an updating process for the storage region A3.

FIG. 8 is an exemplary flowchart illustrating the updating process for the storage region A3. When an instruction of the updating process of the storage region A3 is received from the control unit 111 (S400), the updating unit 115 determines whether the matching length L3a obtained through the process of the reference unit 114 is shorter than the predetermined length Lmin (S401). When the matching length L3a is shorter than the predetermined length Lmin (Yes in S401), the updating unit 115 determines whether the matching length L2a obtained through the process of the reference unit 112 is equal to or greater than the predetermined length Lmin (S402). When the matching length L3a is equal to or greater than the predetermined length Lmin (No in S401) and the matching length L2a is shorter than the predetermined length Lmin (No in S402), the updating unit 115 ends the process (S406).

When the matching length L2a is equal to or greater than the predetermined length Lmin (Yes in S402), the updating unit 115 reads data with the matching length L2a from the longest matching position P2a in the storage region A2 (S403). The updating unit 115 stores the data read in S403 at the update position P11 of the storage region A3 (S404). Then, the updating unit 115 updates the update position P11 according to the storage of the data in S404 (S405). In S405, the update position P11 moves by the matching length L2a. Here, "=" of "P11=P11+L2a" expressed in the process of S405 in FIG. 8 indicates a substitution operator. When the process of S405 ends, the updating unit 115 ends the process (S406).

When the process of the updating unit 115 ends, the control unit 111 causes the updating unit 113 to execute the updating process to the storage region A2 (S107).

Figure 9:
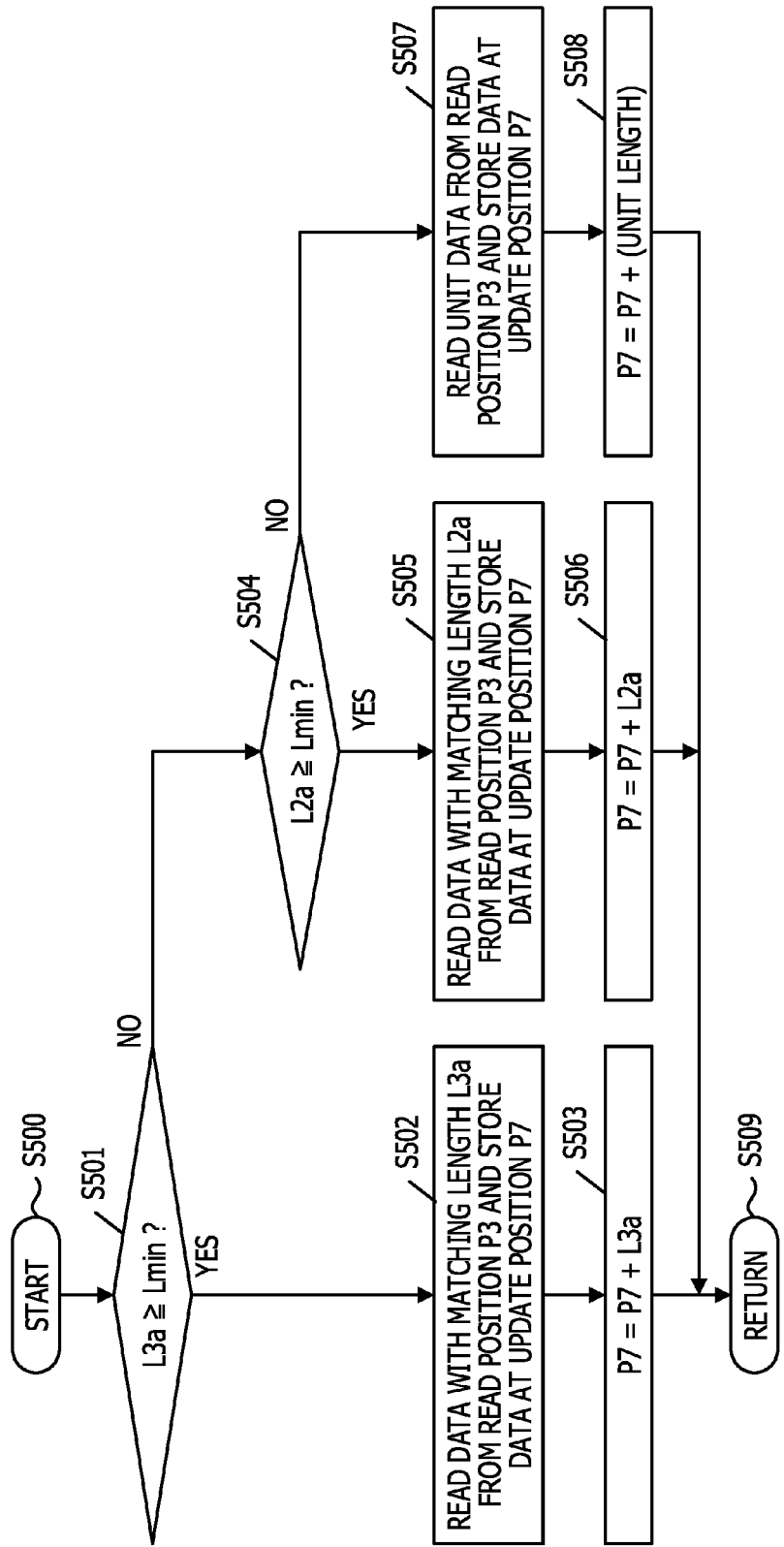
FIG. 9 is an exemplary flowchart illustrating an updating process for the storage region A2.

FIG. 9 is an exemplary flowchart illustrating an updating process for the storage region A2. When an instruction of the updating process for the storage region A2 is received from the control unit 111 (S500), the updating unit 113 determines whether the matching length L3a obtained through the process of the reference unit 114 is equal to or greater than the predetermined length Lmin (S501).

When the matching length L3a is equal to or greater than the predetermined length Lmin (Yes in S501), the updating unit 113 reads the data with the matching length L3a from the read position P3 of the storage region A1 and stores the read data at the update position P7 of the storage region A2 (S502). The updating unit 113 updates the update position P7 according to the storage of the data in S502 (S503). In S503, the update position P7 moves by the matching length L3a. Here, "=" of "P7=P7+L3a1" in the process of S503 in FIG. 9 indicates a substitution operator.

When the matching length L3a is not equal to or greater than the predetermined length Lmin (No in S501), it is further determined whether the matching length L2a is equal to or greater than the predetermined length Lmin (S504). When it is determined in the determination of S504 that the matching length L2a is equal to or greater than the predetermined length Lmin (Yes in S504), the updating unit 113 reads the data with the matching length L2a from the read position P3 of the storage region A1 and stores the read data at the update position P7 of the storage region A2 (S505). The updating unit 113 updates the update position P7 according to the storage of the data in S505 (S506). In S506, the update position P7 moves by the matching length L2a. Here, "=" of "P7=P7+L2a" in the process of S506 in FIG. 9 indicates a substitution operator.

Conversely, when the matching length L2a is shorter than the predetermined length Lmin (No in S504), the updating unit 113 reads the unit data from the read position P3 of the storage region A1 and stores the read data at the update position P7 of the storage region A2 (S507). The updating unit 113 updates the update position P7 (S508). In S508, the update position P7 moves by the length of the unit data. The unit data is, for example, information regarding units of characters or the like. In the embodiment, the unit data is expressed by a data amount such as an increment such as an increment of the counter value j, the reference position P10, or the like. Here, "=" of "P7=P7+(unit length)" in the process of S508 in FIG. 9 indicates a substitution operator.

When the process of S503, S506, or S508 is executed, the updating unit 113 ends the process (S509). When the process of the updating unit 113 ends, the control unit 111 generates the compressed data and writes the generated compressed data on the write position P14 of the storage region A4 (S108).

Figure 10:
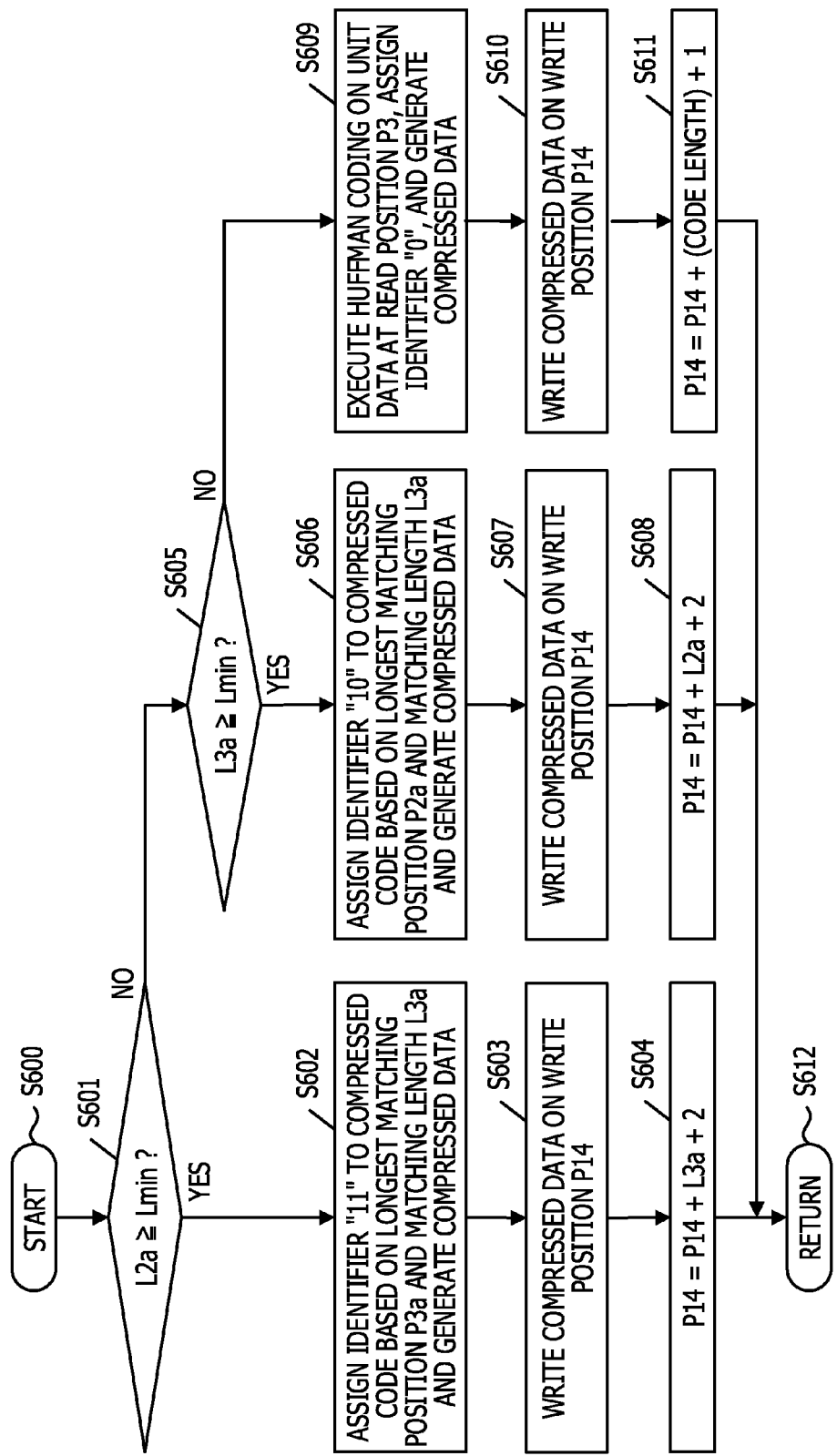
FIG. 10 is an exemplary flowchart illustrating generation and writing of compressed data.

FIG. 10 is an exemplary flowchart illustrating generation and writing of the compressed data. When the control unit 111 starts generation and writing processes (S600), the control unit 111 determines whether the matching length L3a obtained through the process of the reference unit 114 is equal to or greater than the predetermined length Lmin (S601).

When the matching length L3a is equal to or greater than the predetermined length Lmin (Yes in S601), the control unit 111 generates a compressed coded based on the longest matching position P3a and the matching length L3a, assigns the identifier "11" to the generated compressed code, and generates compressed data (S602). The control unit 111 writes the compressed data on the write position P14 generated in S603 (S603). Further, the control unit 111 updates the write position P14 (S604). In S604, the write position P14 moves by bits of the matching length L3a+2. The matching length L3a is a write size of the compressed code and 2 bits are a write size of the identifier assigned to the compressed code. Here, "=" of "P14=P14+L3a+2" in the process of S604 in FIG. 10 indicates a substitution operator.

When the matching length L3a is not equal to or greater than the predetermined length Lmin (No in S601), it is determined whether the matching length L2a is equal to or greater than the predetermined length Lmin (S605). When it is determined in the determination of S605 that the matching length L2a is equal to or greater than the predetermined length Lmin (Yes in S605), the control unit 111 generates the compressed code based on the longest matching position P2a and the matching length L2a, assigns the identifier "10" to the generated compressed code, and generates the compressed data (S606). The control unit 111 writes the compressed data generated in S606 on the write position P14 (S607). Further, the control unit 111 updates the write position P14 (S608). In S608, the write position P14 moves by bits of the matching length L2a+2. The matching length L2a is a write size of the compressed code and 2 bits are a write size of the identifier assigned to the compressed code. Here, "=" of "P14=P14+L2a+2" in the process of S608 in FIG. 10 indicates a substitution operator.

Conversely, when the matching length L2a is shorter than the predetermined length Lmin (No in S605), the control unit 111 executes the Huffman coding on the unit data at the read position P3, assigns the identifier "0" to the Huffman code, and generates compressed data (S609). As described above, when a compression process other than the embodiment is set to be executed as well as the Huffman coding, the control unit 111 executes the compression process according to the setting, assigns the identifier "0" to the data obtained through the compression process, and generates the compressed data. When the compression process is set not to be executed, the control unit 111 assigns the identifier to the unit data and generates the compressed data. The control unit 111 writes the compressed data generated in S601 on the write position P14 (S607). Further, the control unit 111 updates the write position P14 (S611). In S611, the write position P14 moves by bits of the matching length of the generated Huffman code+1. Here, 1 bit is a write size of the identifier assigned to the compressed code. Here, "=" of "P14=P14+(unit length)+1" in the process of S611 in FIG. 10 indicates a substitution operator.

When the process of S604, S608, or S611 is executed, the control unit 111 ends the process (S612). The example of the compressed data generated in the order of FIG. 10 will be described with reference to FIG. 11. Then, the control unit 111 updates the positions of the storage region A1 and the read position P3 (S109). In S109, the read position P3 moves by an amount corresponding to the matching length L3a. When the matching length L3a is shorter than the predetermined length Lmin, the read position P3 moves by the unit length. When the matching length L3a is equal to or greater than the predetermined length Lmin, the read position P3 moves by the matching length L3a. The control unit 111 determines whether the updated read position P3 reaches the end position P2 of the file F1 (S110). When the read position P3 does not reach the end position P2 of the file F1 (No in S110), the control unit 111 executes the process of S104 again.

When the read position P3 reaches the end position P2 of the file F1 (Yes in S110), the control unit 111 generates the compressed file F2 based on the compressed data stored in the storage region A4 (S111). Identification information indicating that the compression process of the embodiment is executed is included in the header or the like of the compressed file F2. When the process of S111 ends, the control unit 111 ends the compression function (S112). For example, in S112, the control unit 111 notifies a callee of the compression function that the compression process ends.

Through the above-described compression process, a compression process is executed using the storage regions A3 and A2 as work areas. When data with the length is repeated many times in the file F1, the data is stored in the storage region A3, and thus the compressed code is generated by searching the storage region A3. In this case, searching the storage region A2 is suppressed. When the compressed code is not generated by searching the storage region A3, searching the storage region A2 is executed and the searching result is reflected to the storage region A3. Therefore, the compressed code is efficiently generated through only the searching of the storage region A3.

Figure 11:
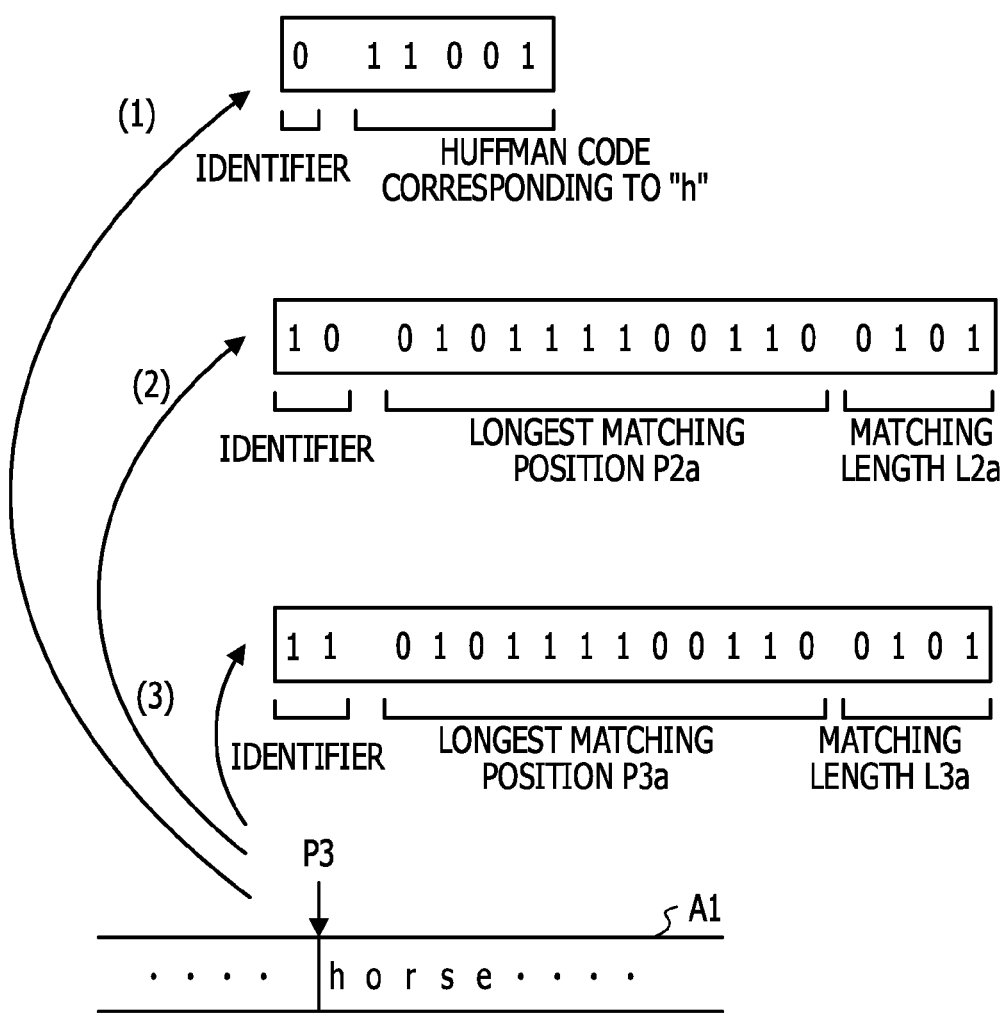
FIG. 11 is a diagram illustrating an example of the format of the compressed data.

FIG. 11 is a diagram illustrating an example of the format of the compressed data. In the example of FIG. 11, the data "horse . . ." is stored from the read position P3 in the storage region A1. In this case, (1) of FIG. 11 illustrates an example of the compressed data when both of the matching length L3a and the matching length L2a are shorter than the predetermined length Lmin. Further, (2) of FIG. 11 illustrates an example of the compressed data when the matching length L3a is shorter than the predetermined length Lmin and the matching length L2a is equal to or greater than the predetermined length Lmin. Furthermore, (3) of FIG. 11 illustrates an example of the compressed data when the matching length L3a is equal to or greater than the predetermined length Lmin.

In (1) of the example of the compressed data, the identifier "0" and the Huffman code are included. The identifier "0" indicates that the compressed code is not the compressed code by the compression process of the embodiment. The Huffman code included in (1) of the example of the compressed data is the Huffman code corresponding to the character "h" which is the unit data present at the read position P3. The compressed code may not be the Huffman code, but may be a compressed code compressed through another compression process different from the compression process of the embodiment.

In (2) of the example of the compressed code, the identifier, the longest matching position P2a, and the matching length L2a are included. The beginning bit "1" of the identifier "10" indicates the compressed code using the compression process of the embodiment. The longest matching position P2a indicates the presence position of data which longest matches the processing target data in the storage region A2. In the example of FIG. 11, the longest matching position P2a is expressed with 12 bits and is thus 0x5E6. In this example, 12 bits are used to express the position of data in a data string configured by 1-byte characters. Since values 0 to 4095 may be expressed in 12-bit data, the longest matching position P2a may express a position in a data string of about 4 KB. The size of the storage region A2 in which the longest matching position P2a may express a position with 12 bits is about 4 KB, but is less than 4 KB. In other words, the number of bits of the longest matching position P2a is decided according to the setting of the size of the storage region A2. For example, when the storage region A2 is 4 KB, the longest matching position P2a is expressed with 12 bits. The matching length L2a indicates 0x5. Since the matching length L2a is 0x5, a longest matching data string in the example of FIG. 11 is 5 characters of "horse". Since 4 bits are used to express the matching length L2a, the matching length L2a may express up to 0xF (15 in decimal number) in the example of FIG. 11. The number of bits expressing the matching length L2a is decided according to the setting of the predetermined length Lmax.

In (3) of the example of the compressed code, the identifier, the longest matching position P3a, and the matching length L3a are included. The beginning bit "1" of the identifier "11" indicates the compressed code using the compression process of the embodiment. The longest matching position P3a indicates the presence position of data which longest matches the processing target data in the storage region A3. In the example of FIG. 11, the longest matching position P3a is expressed with 12 bits and is thus 0x5E6. In this example, 12 bits are used to express the position of data in a data string configured by 1-byte characters. Therefore, the size of the storage region A3 is about 4 KB or less than 4 KB. The matching length L3a indicates 0x5. Since the matching length L3a is 0x5, a longest matching data string in the example of FIG. 11 is 5 characters of "horse". Since 4 bits are used to express the matching length L3a, the upper limit of the predetermined length Lmax may express up to 0xF (15 in decimal numbers) in the example of FIG. 11.

Figure 12:
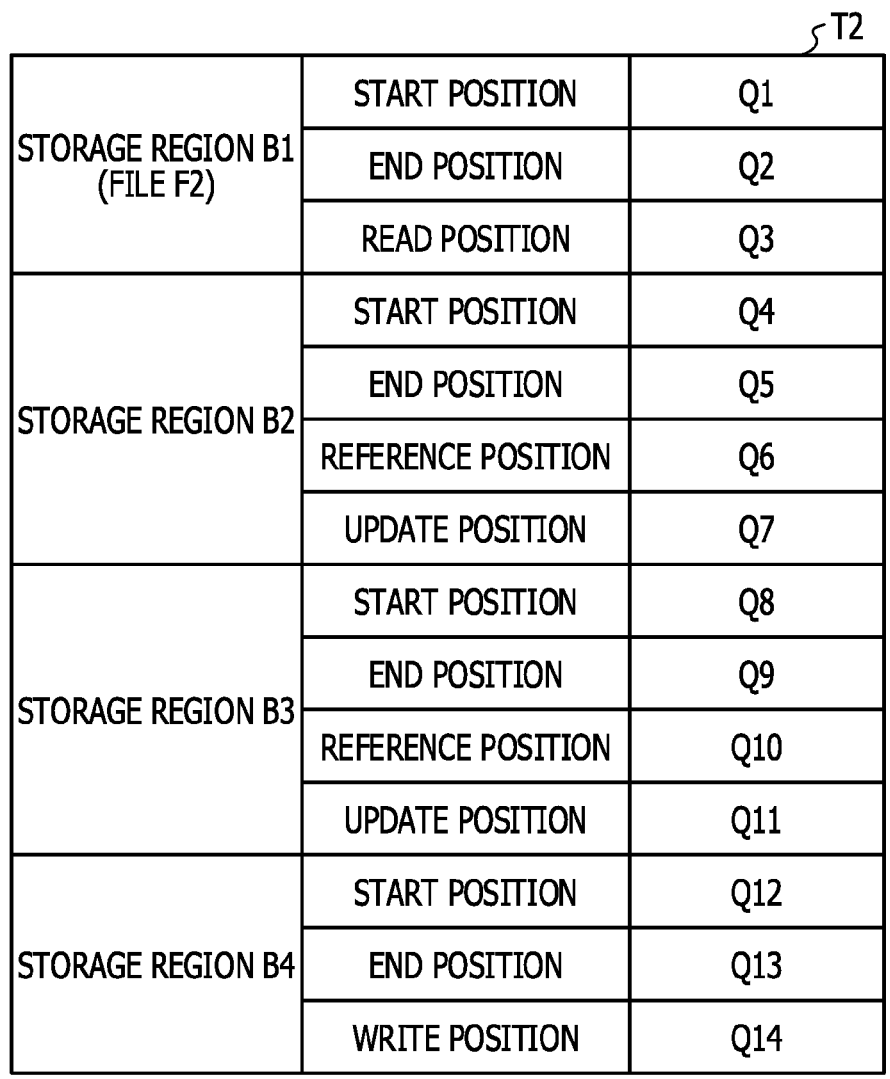
FIG. 12 is a diagram illustrating an example of a position information table T2.

FIG. 12 is a diagram illustrating an example of a position information table T2 used to manage the position information of the storage region. The position information table T2 is used to manage the positions of storage regions (the storage region B1, the storage region B2, the storage region B3, the storage region B4, and the like) used for the decompression process in the management of the position in the storage unit 13. The position information table T2 includes a start position Q1, an end position Q2, and a read position Q3 of the storage region B1 loaded to the file F2. The position information table T2 includes a start position Q4, an end position Q5, a reference position Q6, and an update position Q7 of the storage region B2. The position information table T2 includes a start position Q8, an end position Q9, a reference position Q10, and an update position Q11 of the storage region B3. The position information table T2 includes a start position Q12, an end position Q13, and a write position Q14 of the storage region B4 reserved for generating the file F3. An initial value of each piece of position information stored in the position information table T2 is set by the control unit 121. The start position and the end position of each storage region indicate a storage start position and end position of data to be compressed or decompressed. Since a header or the like is excluded, for example, the initial value of the read position Q3 is the same as the start position Q1. The initial values of the reference position Q6 and the update position Q7 are also the same as the start position Q4. The initial values of the reference position Q10 and the update position Q11 are also the same as the start position Q8 and the write position Q14 is also the same as the start position Q12.

Figure 13:
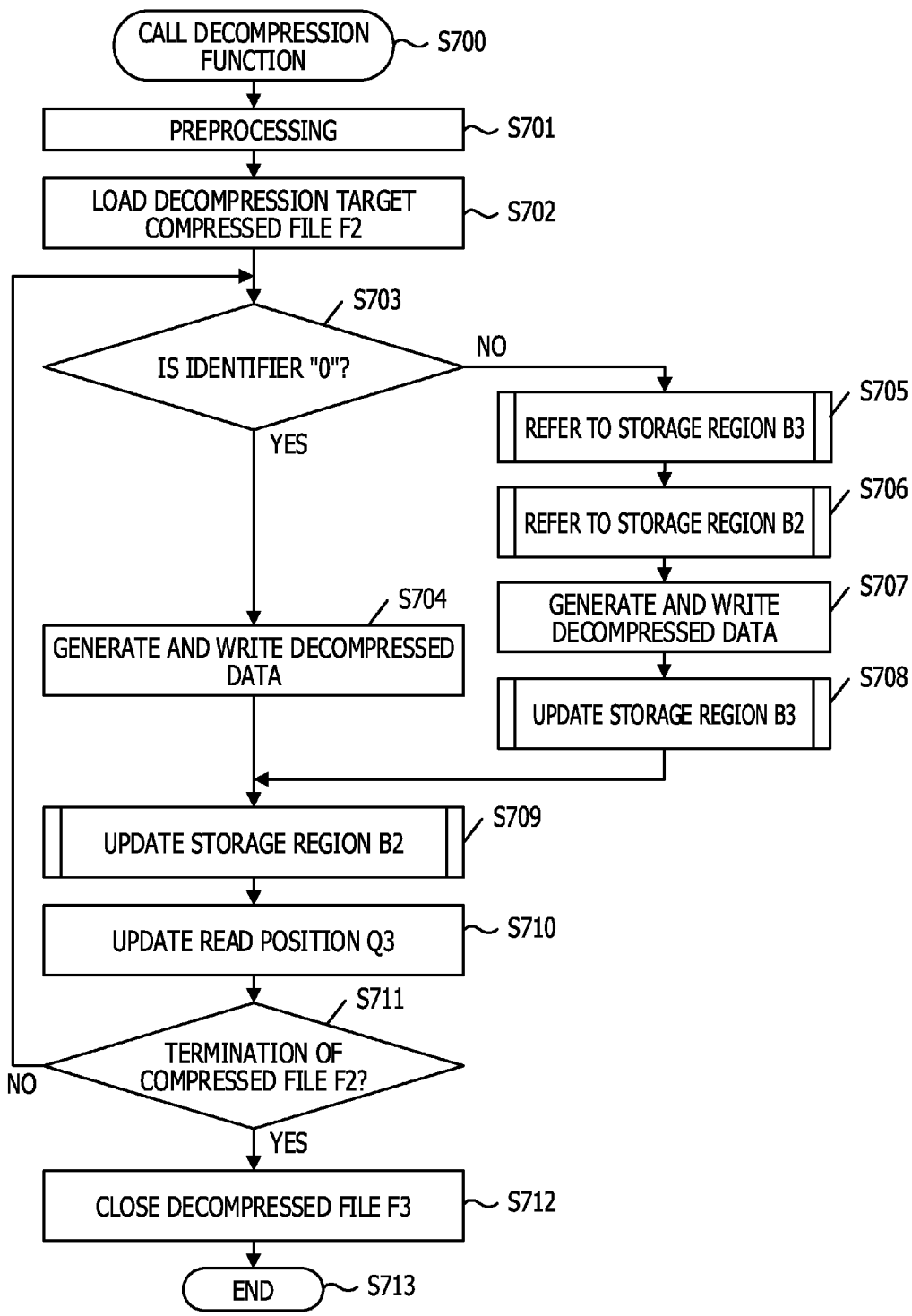
FIG. 13 is an exemplary flowchart illustrating a decompression process.

FIG. 13 is an exemplary flowchart illustrating the decompression process. When the decompression function is first called through an operation of an operating system or an application program in the computer 1 (S700), the control unit 121 executes preprocessing (S701). The preprocessing of S701 is, for example, reservation of the storage region B1, the storage region B2, and the storage region B3 illustrated in FIG. 2, reservation of the storage region B4 in which decompressed data is stored, and setting of each piece of position information (for example, each piece of position information illustrated in FIG. 12) in each storage region. The process of S701 may be executed only when an identifier indicating that the compression process of the embodiment is executed is included in the header of the compressed file. When the process of S701 ends, the control unit 121 loads the decompression target file F2 to the storage region B1 (S702). The control unit 121 sets the end position Q2 based on termination of the file F2.

Next, referring to the data (identifier) of the read position Q3 of the storage region B1, the control unit 121 determines whether the identifier indicates the compressed code (the identifier "0") by the compression process of the embodiment or does not indicate the compressed code (the identifier "10" or "11") (S703). According to the format of the compressed data exemplified in FIG. 11, since the beginning of the compressed data is the identifier, the data at the read position Q3 is the identifier. When the identifier is assigned to another position in the compressed data, the control unit 121 refers to this position in S703.

When the identifier is "0" in S703 (Yes in S703), the control unit 121 generates the decompressed data and writes the generated decompressed data at the write position Q14 of the storage region B4 (S704). The decompressed data generated in S704 is data obtained by decompressing the Huffman code included in the compressed data. As described above, when the compressed data is generated using coding other than the Huffman coding, the decompression process is executed according to the compression process. The control unit 121 delays the write position Q14 of the decompressed data by the length (unit length) of the unit data. Conversely, when the identifier is "10" or "11" in S703 (No in S703), the control unit 121 causes the reference unit 124 to refer to the storage region B3.

Figure 14:
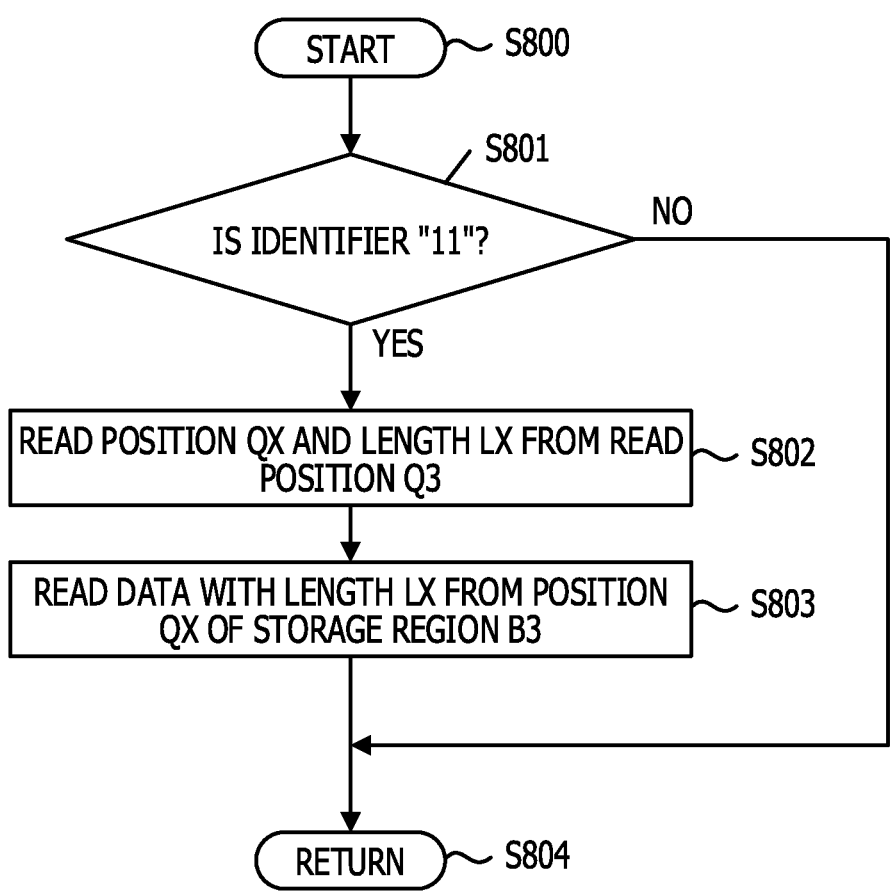
FIG. 14 is an exemplary flowchart illustrating a reference process for a storage region B3.

FIG. 14 is an exemplary flowchart illustrating a reference process for the storage region B3. When the reference unit 124 receives an instruction of the reference process of the storage region B3 from the control unit 121 (S800), the reference unit 124 determines whether the identifier is "11" or not (the identifier "10") (S801). When the identifier is "11" (Yes in S801), the reference unit 124 reads the compressed code from the read position Q3 of the storage region B1 (S802). The reference unit 124 reads the data with a length LX from a position QX in the storage region B3 based on the position QX and the length LX indicated in the compressed code (S803). The position QX indicates the longest matching position in the storage region A3 at the time of the compression process. The length LX indicates the matching length P3a of the longest matching data string at the time of the compression process. The reference unit 124 returns the data read in S803 to the control unit 121 after the process of S803. However, when the identifier is not "11" in the determination of S801 (No in S801), the process ends (S804).

Figure 15:
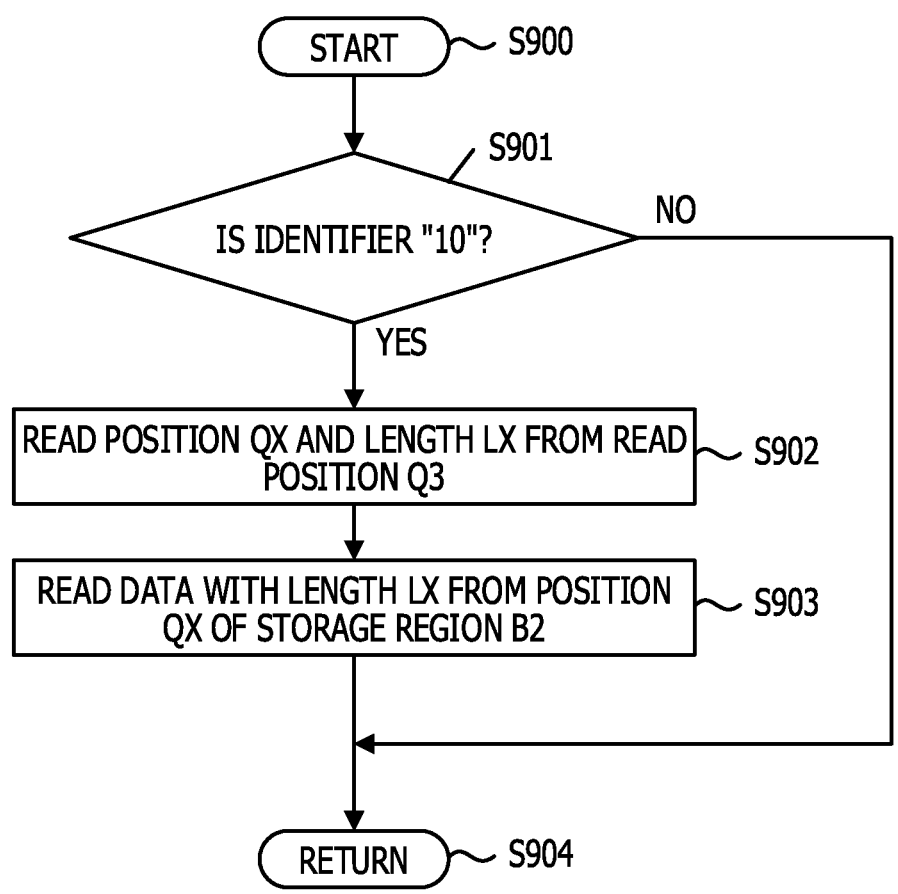
FIG. 15 is an exemplary flowchart illustrating a reference process for a storage region B2.

FIG. 15 is an exemplary flowchart illustrating a reference process for the storage region B2. When the reference unit 122 receives an instruction of the reference process of the storage region B2 from the control unit 121 (S900), the reference unit 122 determines whether the identifier is "10" or not (the identifier "11") (S901). When the identifier is "10" (Yes in S901), the reference unit 122 reads the compressed code from the read position Q3 of the storage region B1 (S902). The reference unit 122 reads the data with the length LX from the position QX in the storage region B2 based on the position QX and the length LX indicated in the compressed code (S903). The position QX indicates the longest matching position in the storage region A2 at the time of the compression process. The length LX indicates the matching length P2a of the longest matching data string at the time of the compression process. The reference unit 122 returns the data read in S903 to the control unit 121 after the process of S903. However, when the identifier is not "10" in the determination of S901 (No in S901), the process ends (S904).

The control unit 121 generates the decompressed data according to the reference results of S705 and S706 and writes the generated decompressed data on the write position Q14 of the storage region B4 (S707). That is, in S707, the control unit 121 writes the data read in S803 or S903 as the decompressed data on the write position Q14.

Further, the control unit 121 instructs the updating unit 125 of the updating process of the storage region B3 based on the reference result of the reference unit 122 (S708).

Figure 16:
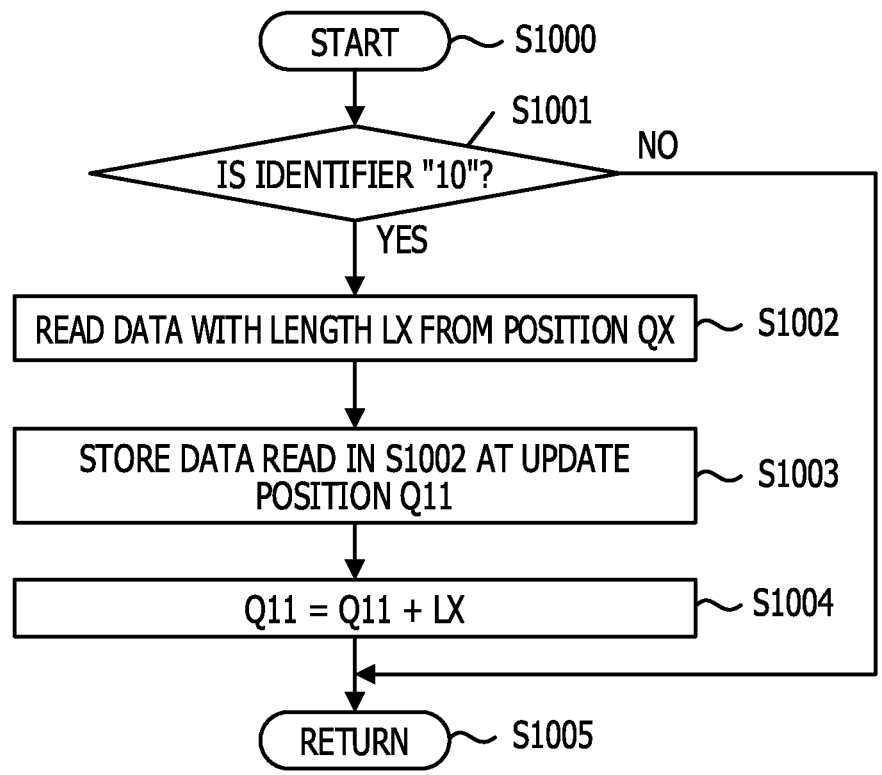
FIG. 16 is an exemplary flowchart illustrating an updating process for the storage region B3.

FIG. 16 is an exemplary flowchart illustrating an updating process for the storage region B3. When an instruction of the updating process of the storage region B3 is received from the control unit 121 (S1000), the updating unit 125 determines whether the identifier of the processing target compressed data is "10" (S1001). When the identifier is "10" (Yes in S1001), the updating unit 125 reads the data with the length LX from the position QX of the storage region B2 (S1002). The updating unit 125 stores the data read in S1002 at the update position Q11 of the storage region B3 (S1003). The updating unit 125 updates the update position Q11 according to the storage of S1003 (S1004). In S1004, the update position Q11 moves by the length LX. When the identifier is not "10" (No in S1001) and the process of S1004 is executed, the updating unit 125 ends the process (S1005).

When the process of the updating unit 125 ends (the process of S708 ends) and the process of S704 ends, the control unit 121 instructs the updating unit 123 of the updating process of the storage region B2 (S709). The processing order of the process of S705 and the process of S706 executed by the control unit 121 may be permutated. The processing order of the process of S707 and the process of S708 may be permutated.

Figure 17:
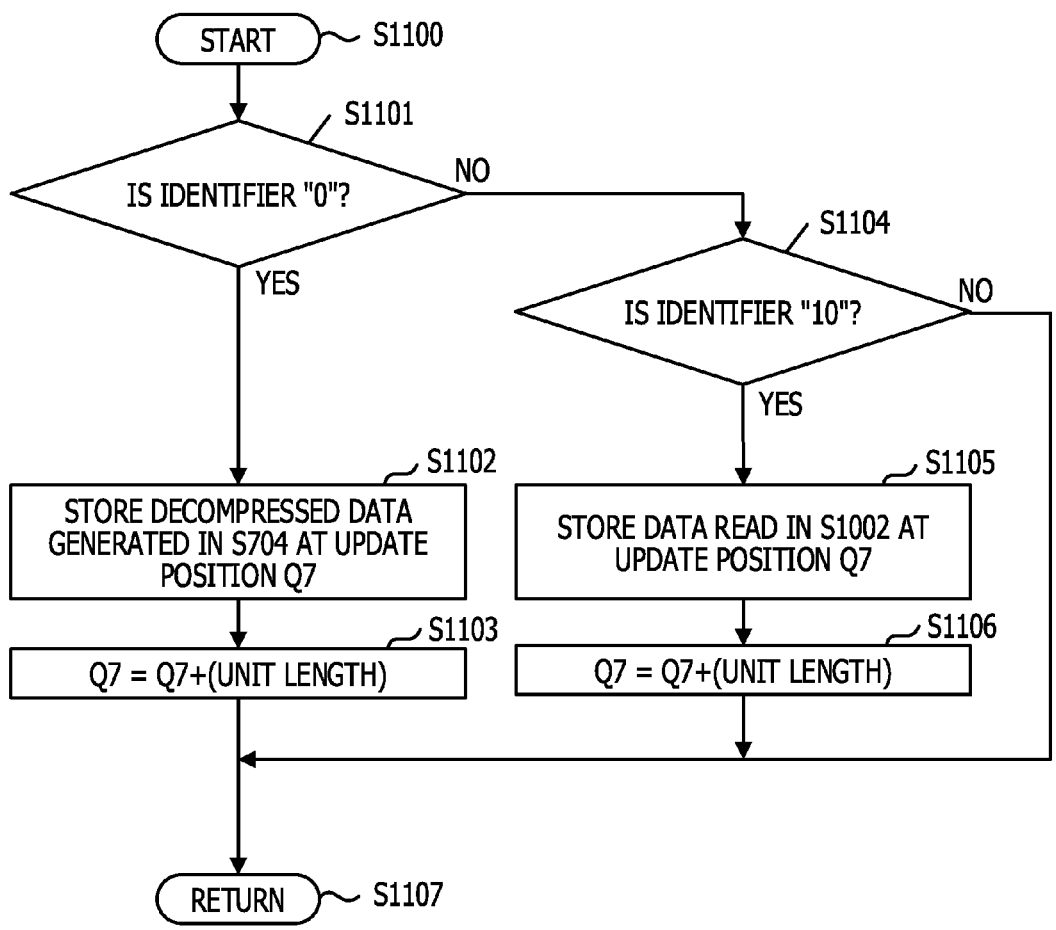
FIG. 17 is an exemplary flowchart illustrating an updating process for the storage region B2.

FIG. 17 is an exemplary flowchart illustrating an updating process for the storage region B2. When an instruction of the updating process of the storage region B2 is received by the control unit 121 (S1100), the updating unit 123 determines whether the identifier of the processing target compressed data is "0" (S1101). When the identifier is "0" in S1101 (Yes in S1101), the updating unit 123 stores the decompressed data generated in S704 at the update position Q7 (S1102). The updating unit 123 updates the update position Q7 according to the storage of S1102 (S1103). In the updating of S1103, the update position Q7 moves by the length (unit length) of the unit data.

When the identifier is not "0" in S1101 (No in S1110), the updating unit 123 determines whether the identifier is "10" (S1104). When the identifier is "10" (Yes in S1104), the data read from the storage region B2 in S1002 is stored at the update position Q7 (S1105). The updating unit 123 updates the update position Q7 according to the storage of S1105 (S1106). In the updating of S1106, the update position Q7 moves by the length (unit length) of the unit data. When the process of S1103 or S1106 is executed and the identifier is not "10" in S1104 (No in S1104), the updating unit 123 ends the process (S1107).

When the updating unit 123 ends the updating process of the storage region B2, the control unit 121 updates the read position Q3 (S710). In S710, the read position Q3 moves by an amount according to the compressed data. The control unit 121 determines whether the updated read position Q3 reaches the end position Q2 of the compressed file F2 (S711). When the updated read position Q3 does not reach the end position Q2 of the compressed file F2 (No in S711), the control unit 121 executes the process of S703 again.

When the read position Q3 reaches the end position Q2 of the compressed file F2 (Yes in S711), the control unit 121 generates the decompressed file F3 based on the decompressed data stored at the storage region B4 (S712). When the process of S712 ends, the control unit 121 ends the decompression function (S713). For example, in S713, the control unit 121 notifies a callee of the decompression function that the decompression process ends.

For the compressed data with the identifier "0", the decompressed data is generated and is stored in the storage region B2 and the decompressed data is combined with the data in the storage region B2 in the decompression process corresponding to the modification example of the compression process, as described above in the description of FIG. 2. When the longest matching data string which matches the decompressed data by the length equal to or greater than the predetermined length Lmin is present in the storage region B2 as the result of the cross-checking, the longest matching data string is stored in the storage region B3. Thus, the storage region B3 enters the same state as the storage region A3. That is, the reference unit 122 executes the process of combining the decompressed data obtained from the compressed data with the identifier "0" with the data in the storage region B2, and the updating unit 125 updates the storage region B3 according to the cross-checking result of the reference unit 122.

Figure 18:
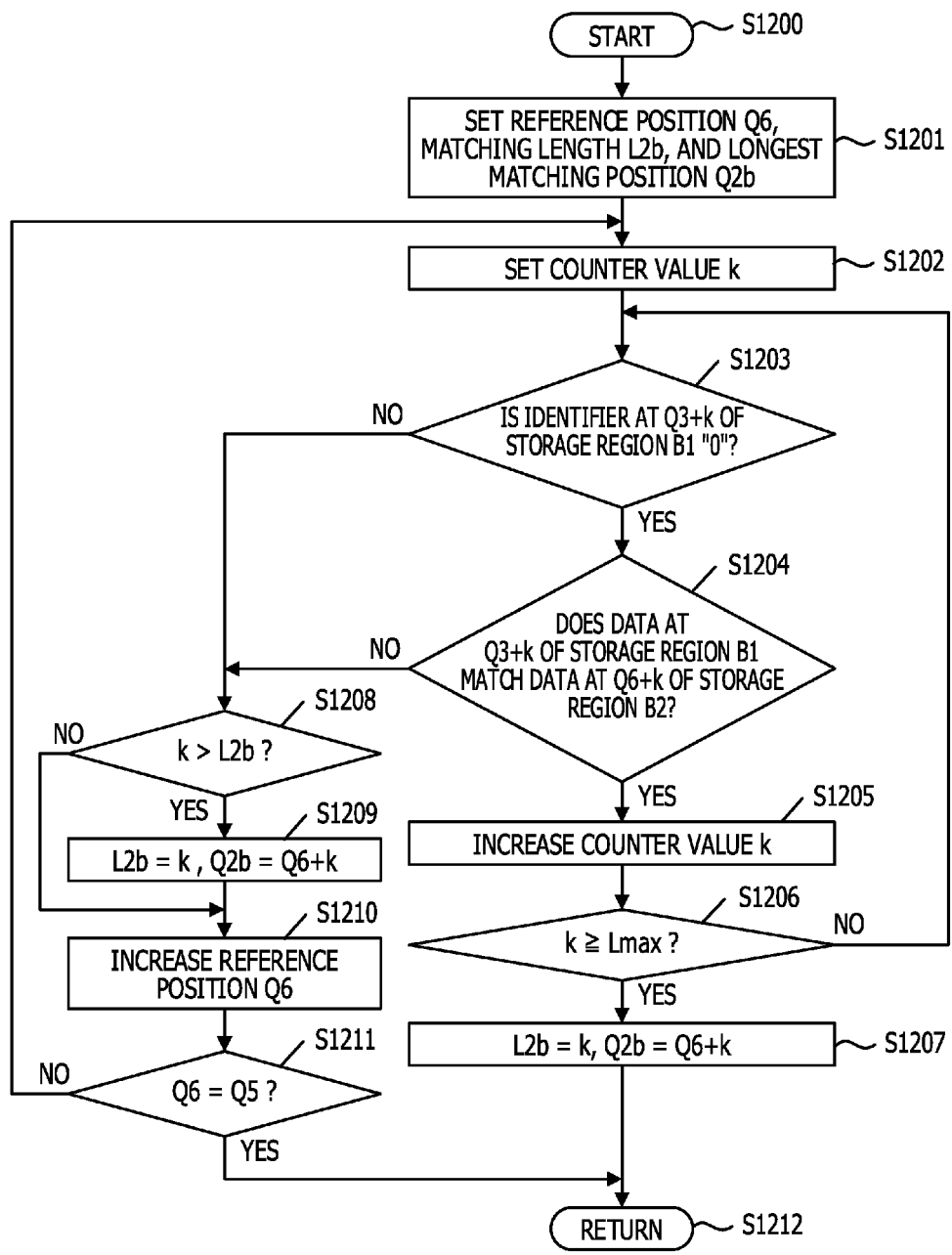
FIG. 18 is an exemplary flowchart illustrating a reference process for a storage region B2.

FIG. 18 is an exemplary flowchart illustrating a reference process for a storage region B2. When an instruction of the reference process of the storage region B2 is received by the control unit 121 (S1200), the reference unit 122 sets the reference position Q6, the matching length L2b, and the longest matching position Q2b (S1201). The reference position Q6 and the longest matching position Q2b are set to be the same as the start position Q4 or the same as the update position Q7. The matching length L2b is set to, for example, "0". The reference unit 112 further sets a counter value k to an initial value (for example, k=0) (S1202).

The reference unit 122 determines whether the identifier of the data at the position (Q3+k) moving by the counter value k from the read position Q3 of the storage region B1 does not indicate the compressed code by the compression process of the embodiment or not (the identifier "0") (S1203). When the identifier at the position (Q3+k) is not the compressed code by the compression process of the embodiment (the identifier "0") (Yes in S1203), the reference unit 122 determines whether the unit data in the storage region B1 matches the unit data in the storage region B2 (S1204). In this determination, it is determined whether the unit data at the position (Q3+k) moving by the counter value k from the read position Q3 of the storage region B1 matches the unit data at a position (Q6+k) moving by the counter value k from the reference position Q6 of the storage region B2.

When the unit data at the position (Q3+k) matches the unit data at the position (Q6+k) (Yes in S1204), the reference unit 122 increases the counter value k (S1205). The reference unit 122 further determines whether the counter value k is equal to or greater than a predetermined length Lmax (S1206). The predetermined length Lmax is the same as the predetermined length Lmax in FIG. 7. When the counter value k is equal to or greater than the predetermined length Lmax (Yes in S1206), the reference unit 122 substitutes the counter value k to the matching length L2b and substitutes the value of the reference position Q6 to the longest matching position Q2b (S1207). Here, "=" expressed in the process of S1207 of FIG. 18 indicates a substitution operator. When the counter value k is not equal to or greater than the predetermined length Lmax (No in S1206), the reference unit 122 executes the determination of S1203 again. S1206 and S1207 are an additional order. When S1205 is executed, the determination of S1203 may be necessarily executed.

When the identifier at the position (Q3+k) is "10" or "11" (No in S1203) and the unit data at the position (Q3+k) does not match the unit data at the position (Q6+k) (No in S1204), the reference unit 122 determines whether the counter value k is greater than the matching length L2b (S1208). When the counter value k is greater than the matching length L2b (Yes in S1208), the reference unit 122 substitutes the counter value k to the matching length L2b and substitutes the value of the reference position Q6 to the longest matching position Q2b (S1209). When the counter value k is equal to or less than the matching length L2b (No in S1208) and the process of S1209 is executed, the reference unit 122 increases the reference position Q6 (S1210).

The reference unit 122 determines whether the reference position Q6 increased in S1210 reaches the end position Q5 (S1211). When the reference position Q6 is set at the start position Q4 in S1211 and, as described above, the reference position Q6 is set at the update position Q7, it is determined in S1211 whether the reference position Q6 is the update position Q7. When the reference position Q6 is initially set at the update position Q7 and the reference position Q6 reaches the end position Q5, the reference position Q6 returns to the start position Q4 through the process of S1210. Here, "=" of "Q6=Q5" expressed in the process of S1211 of FIG. 18 is an equal sign. When the reference position Q6 is not the end position Q5 (No in S1211), the reference unit 122 executes the process of S1202 again.

When the reference position Q6 is the end position Q5 (Yes in S1211) and the process of S1207 is executed, the reference unit 122 returns the longest matching position Q2b and the matching length L2b to the control unit 121 and the reference process of the storage region B2 ends (S1212).

When the matching length L2b obtained in the order of FIG. 18 is equal to or greater than the predetermined length Lmin, the control unit 121 causes the updating unit 125 to execute the updating process for the storage region B3. The updating unit 125 reads the data with the length L2b from the longest matching position Q2b in the storage region B2 and stores the read data at the update position Q14 of the storage region B3. Through the process of the updating unit 125, in the modification example, the storage region B3 is maintained to be the same as the storage region A3.

In the above-described decompression process, the decompression is executed while updating the storage region B3 to the same state as the storage region A3 used in the compression process.

Hereinafter, hardware and software used in the embodiment will be described.

Figure 19:
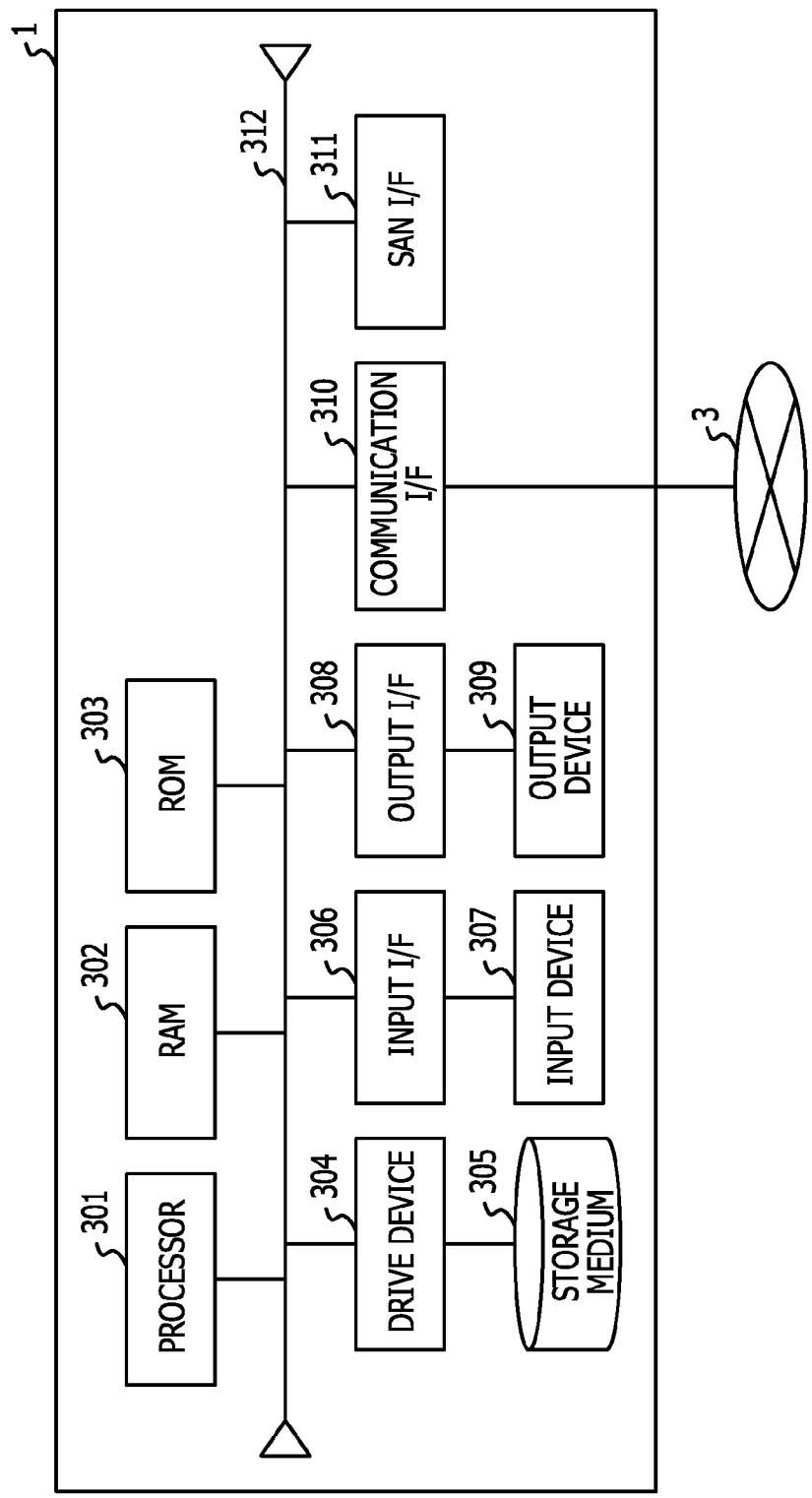
FIG. 19 is a diagram illustrating an exemplary hardware configuration of a computer.

FIG. 19 is a diagram illustrating an exemplary hardware configuration of the computer 1. The computer 1 includes, for example, a processor 301, a random access memory (RAM) 302, a read-only memory (ROM) 303, a drive device 304, a storage medium 305, an input interface (I/F) 306, an input device 307, an output interface (I/F) 308, an output device 309, a communication interface (I/F) 310, a storage area network (SAN) interface (I/F) 311, and a bus 312. Each hardware is connected via the bus 312.

The RAM 302 is a memory device capable of executing reading and writing. For example, semiconductor memory such as a static RAM (SRAM) or a dynamic RAM (DRAM) or a flash memory rather than a RAM is used. The ROM 303 includes a programmable ROM (PROM). The drive device 304 is a device that executes at least one of reading and writing of information recorded on the storage medium 305. The storage medium 305 stores information written by the drive device 304. The storage medium 305 is, for example, a storage medium such as a hard disk, a flash memory such as a solid state drive (SSD), a compact disc (CD), a digital versatile disc (DVD), or a Blu-ray disc. For example, the computer 1 includes the drive device 304 and the storage medium 305 in regard to a plurality of kinds of storage media.

The input interface 306 is a circuit that is connected to the input device 307 and delivers an input signal received from the input device 307 to the processor 301. The output interface 308 is a circuit that is connected to the output device 309 and causes the output device 309 to execute output according to an instruction from the processor 301. The communication interface 310 is a circuit that controls communication via the network 3. The communication interface 310 is, for example, a network interface card (NIC). The SAN interface 311 is a circuit that controls communication with a storage device connected to the computer 1 via a storage area network. The SAN interface 311 is, for example, a host bus adapter (HBA).

The input device 307 is a device that transmits an input signal according to an operation. The input device 307 is, for example, a key device such as a button mounted on a keyboard or the body of the computer 1 or a pointing device such as a mouse or a touch panel. The output device 309 is a device that outputs information according to control of the computer 1. The output device 309 is, for example, an image output device (display device) such as a display or an audio output device such as a speaker. For example, an input/output device such as a touch screen is used as the input device 307 and the output device 309. The input device 307 and the output device 309 may be integrated with the computer 1 or may be, for example, devices connected externally to the computer 1 without being included in the computer 1.

For example, the processor 301 reads a program stored in the ROM 303 or the storage medium 305 to the RAM 302 and executes a process of the compression unit 11 or a process of the decompression unit 12 according to an order of the read program. At this time, the RAM 302 is used as a work area of the processor 301. The function of the storage unit 13 is realized when the ROM 303 and the storage medium 305 store program files (an application program 24, a middleware 23, and an OS 22 to be described below) and data files (the compression target file F1, the compressed file F2, and the like) and the RAM 302 is used as a work area of the processor 301. The program read by the processor 301 will be described with reference to FIG. 22.

Figure 20:
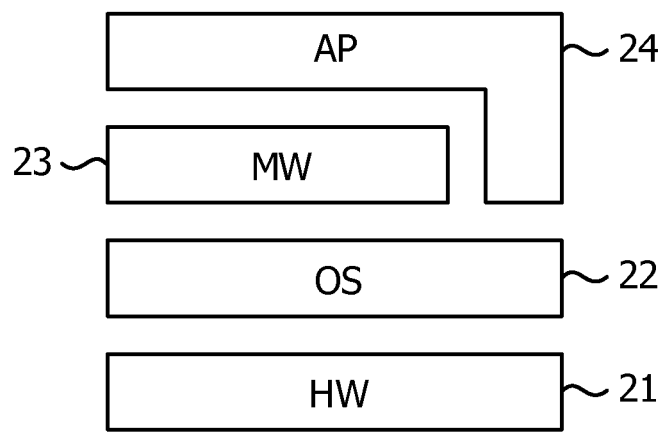
FIG. 20 is a diagram illustrating an example of the configuration of a program operating in the computer.

FIG. 20 is a diagram illustrating an example of the configuration of a program operating in the computer 1. In the computer 1, an operating system (OS) 22 controlling a hardware group 21 (301 to 312) illustrated in FIG. 19 operates. The processor 301 operates in the order according to the OS 22 to control and manage the hardware group 21 so that a process according to the application program 24 or the middleware 23 is realized by the hardware group 21. In the computer 1, the middleware 23 or the application program 24 is read to the RAM 302 and is executed by the processor 301.

When the compression function is called, the processor 301 executes a process based on at least a part of the middleware 23 or the application program 24 (executes the process by controlling the hardware group 21 based on the OS 22) so that the function of the compression unit 11 is realized. When the decompression function is called, the processor 301 executes a process based on at least a part of the middleware 23 or the application program 24 (executes the process by controlling the hardware group 21 based on the OS 22) so that the function of the decompression unit 12 is realized. The compression function and the decompression function may be each included in the application program 24 or may be a part of the middleware 23 called to be executed according to the application program 24.

Since a search range for extracting data matching processing target data is suppressed in the compression function of the application program 24 (or the middleware 23), a load of memory access of the processor 301 is suppressed. Therefore, a time in which the work area is reserved on the RAM 302 is also reduced.

Figure 21:
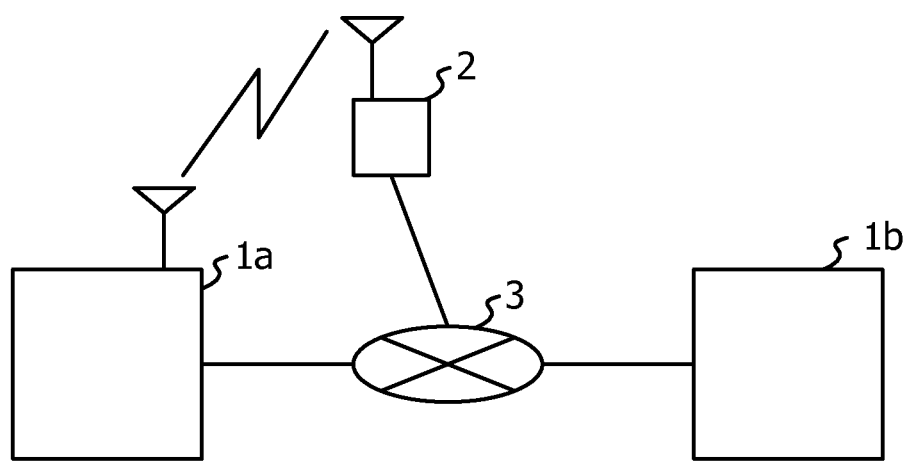
FIG. 21 is a diagram illustrating an example of the configuration of apparatuses in a system according to an embodiment.

FIG. 21 is a diagram illustrating an example of the configuration of apparatuses in a system according to the embodiment. The system in FIG. 21 includes a computer 1a, a computer 1b, a base station 2, and a network 3. The computer 1a is connected to the network 3 connected to the computer 1b in at least one of wireless and wired manners.

The compression unit 11 and the decompression unit 12 illustrated in FIG. 3 may be included in one of the computers 1a and 1b illustrated in FIG. 21. The computer 1b may include the compression unit 11 and the computer 1a may include the decompression unit 12. The computer is may include the compression unit 11 and the computer 1b may include the decompression unit 12. Both of the computers 1a and 1b may include the compression unit 11 and the decompression unit 12.

In the compression process according to the embodiment, a processing time taken to execute the compression process is reduced. In the compression process according to the embodiment, the matching determination is executed again with the data in the storage region in which only the data string determined to be the longest matching data string is stored. Therefore, this advantage may be further obtained when a file is a file (for example, an address book) in which the same data string is used repeatedly.

Hereinafter, an example of a modification example of the above-described embodiment will be described. As well as the following modification example, design modification may be appropriately made within the scope of the disclosure without departing from the gist of the disclosure.

Figure 22:
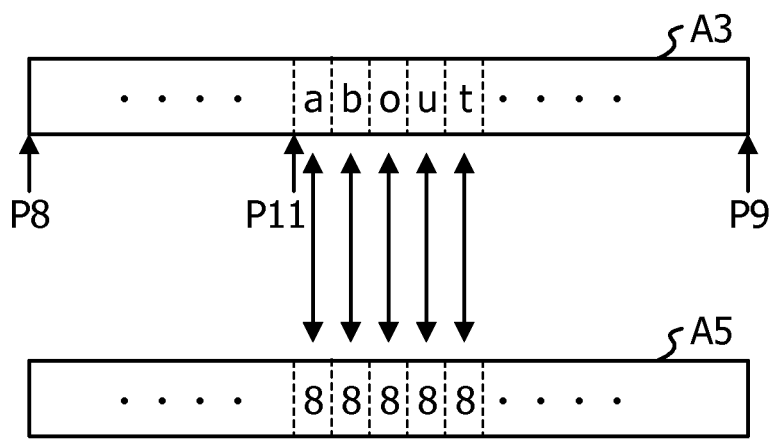
FIG. 22 is a diagram illustrating an example of counting of the number of extractions.

FIG. 22 is a diagram illustrating an example of counting of the number of extractions. The storage region A5 is a storage region in which a numerical value corresponding to each piece of unit data stored in the storage region A3 may be stored. The numerical value corresponding to each piece of unit data indicates the number of times data is extracted as the longest matching data string. In FIG. 22, the number of times the unit data "h" stored in the storage region A3 is extracted as a part of the longest matching data string is 8 times. In the storage region A5, the numerical value corresponding to each piece of unit data is expressed with, for example, 4 bits. Then, the number of times each piece of unit data is extracted up to 15 times may be counted. For example, in S108 of FIG. 5, the number of extractions is counted by increasing each numerical value corresponding to the read data when the control unit 111 reads the data with the matching length L3a from the longest matching position P3a in the storage region A3. When the data is written on the update position P11 in S404 of FIG. 8, the numerical value corresponding to the data at a position at which the writing is executed is reset.

For example, the number of extractions is used at the time of the updating of the storage region A3. When the number of extractions of the data at the position at which the data is stored in S404 is greater than a threshold value, the process of S405 may be executed, and then the data may be stored in the process of S404 again.

When the same data appears many times in the file F1, the data excluded in the storage region A3 may be stored in the storage region A3 again due to the reference to the storage region A2. However, when the number of extractions is counted and data extracted many times is assumed to be registered again in the storage region A3, the number of references to the storage region A2 is suppressed.

When the structure of FIG. 22 is used in the compression process, the same structure is also provided in the decompression process. In the decompression process, the number of extractions in S705 of FIG. 13 is counted. In S1003 of FIG. 16, the value indicating the number of extractions is reset and it is further determined whether the number of extractions is greater than the threshold value. When the number of extractions is greater than the threshold value, the process of S1004 is executed. Thereafter, the process of S1003 is executed and the data is stored in the storage region A3.

Figure 23:
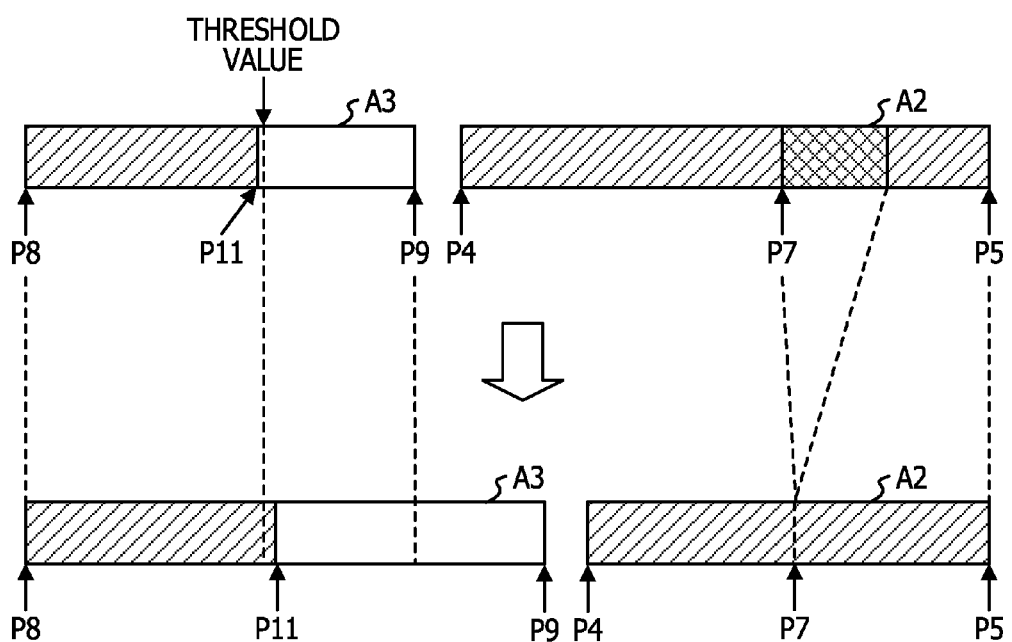
FIG. 23 is a diagram illustrating an example of control of the sizes of the storage region A2 and the storage region A3.

FIG. 23 is a diagram illustrating an example of control of the sizes of the storage region A2 and the storage region A3. According to the order of the above-described compression process, the data stored in the storage region A3 in the initial stage of the compression process is small. When considerable data is stored in the storage region A3, there is a high probability of the compressed code being generated through the compression process according to the embodiment. Therefore, when the data is stored in the storage region A3 as early as possible, a compressed code ratio by the compression process of the embodiment in the compressed file increases, and thus the compression ratio is expected to be improved. When the data is considerable in the storage region A2, the data matching a processing target data is easily found. Therefore, when the data size of the storage region A2 is large, a probability of the data being stored fast in the storage region A3 increases. That is, the initial stage of the compression process, the size of the storage region A3 may not be large. However, when the size of the storage region A2 is large, the compression ratio may be expected to be improved.

On the other hand, when the data is accumulated in the storage region A3, the data matching the processing target data is easily extracted from the storage region A3. When it is easy to execute compression coding on the data in the file F1 by referring to the storage region A3, the compression ratio is maintained even through the updating of the storage region A3 is not frequently executed. On the other hand, since data appearing only once may appear in the file F1 as well as the repeated data, the reference of the storage region A2 may be unnecessarily processed in regard to the data appearing only once.

Accordingly, for example, when data equal to or greater than the threshold value is stored in the storage region A3 (the update position P11 exceeds the threshold value), the control unit 111 may execute control such that the data size of the storage region A2 is decreased. In this case, for example, old data is deleted among the data in the storage region A2. That is, the data corresponding to the change in the data size from the update position P7 is deleted. FIG. 23 schematically illustrates a state in which the data after the update position P7 is excluded from the storage region A2 in the stage in which the update position P11 does not exceed the threshold value and the storage region A2 is in a stage in which the update position P11 exceeds the update position P11.

Control may be executed such that the size of the storage region A2 is decreased and control may be executed such that the size of the storage region A3. Thus, it is possible to reduce frequency at which the data is the data stored in the storage region A3 and included in the longest matching data string many times is deleted through the updating process for the storage region A3 or the control described with reference to FIG. 22 is executed.

When the control of the sizes illustrated in FIG. 23 is executed, the control unit 121 also executes the same control of the sizes on the storage region B2 and the storage region B3. Thus, the code is converted by referring to the same data on the compression side and the decompression side.

A compression processing target may be a monitoring message output from the system as well as the data in the file. For example, processes of compressing monitoring messages stored sequentially in a buffer through the above-described compression process and storing the compressed messages as a log file are executed. For example, compression may be executed in units of pages in a database or compression may be executed in units in which a plurality of pages are organized.

The data to be subjected to the above-described compression process is not limited to character information described above. The data to be subjected to the compression process may be information with only numerical values and the above-described compression process may be used for data such as images or audio. For example, since a file considerably including data obtained through audio synthesis considerably includes repetitions in data, a compression ratio is expected to be improved by a dynamic dictionary. A moving image photographed by a fixed camera also includes many repetitions since images of respective frames are similar. Therefore, it is possible to obtain the same advantages as those of document data or audio data by applying the above-described compression process.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method comprising:
   first setting a first storage region and a second storage region in a memory;
   first comparing, by a first processor, a compression target data in a file with data in the first storage region;
   first creating, by the first processor, a first compression code of the compression target data based on the data in the first storage region when a predetermined first consistency between the compression target data and the data in the first storage region is detected;
   second comparing, by the first processor, the compression target data with data in the second storage region when the predetermined first consistency between the compression target data and the data in the first storage region is not detected, the compression target data being moved to the second storage region after the second comparing;
   first storing, by the first processor, the compression target data into the first storage region when a predetermined second consistency between the compression target data and the data in the second storage region is detected; and
   second creating a second compression code of the compression target data based on the data in the second storage region when a predetermined second consistency between the compression target data and the data in the second storage region is detected based on the second comparing, wherein
   the first compression code and the second compression code are the same type of code and include an identifier indicating being created based on one of the first comparing and the second comparing.

2. The method according to claim 1, wherein
   the predetermined second consistency indicates that a data size of longest matching data between the compression target data and the data in the second storage region is greater than a predetermined second size.

3. The method according to claim 1, further comprising:
   third creating a third compression code of the compression target data based on a different type of coding process than a coding process of the first compression code and the second compression code when the predetermined second consistency between the compression target data and the data in the second storage region is not detected based on the second comparing.

4. The method according to claim 3, wherein
   the second comparing compares the compression target data with the data in the second storage region for a predetermined data unit, and
   the third creating creates the third compression code based on the compression target data with the data unit.

5. The method according to claim 1, wherein
   the second compression code includes position information indicating a position in the second storage region of data portion longest matching with the compression target data among the data in the second storage region and length information indicating a matching length of the data portion.

6. The method according to claim 3, wherein
   a compression file corresponding to the file is created based on the first compression code, the second compression code and the third compression code,
   the method further comprising:
   reading a compressed data from the compression file;
   fourth creating a first decompression data based on data in a fourth storage region according to the first compression code when it is determined that the read compressed data is the first compression code;
   fifth creating a second decompression data based on data in a fifth storage region according to the second compression code when it is determined that the read compressed data is the second compression code, the fifth storage region being a different storage region from the fourth storage region;
   first updating the fourth storage region according to the second compression code and the second decompression data when the second decompression data is created by the fifth creating;
   sixth creating a third decompression data from the read compressed data based on a decoding process corresponding to the coding process when it is determined that the read compressed data is the third compression code; and
   third storing the third decompression data into the fourth storage region.

7. A method comprising:
   first setting a first storage region and a second storage region in a memory;
   first comparing, by a first processor, a compression target data in a file with data in the first storage region;
   first creating, by the first processor, a first compression code of the compression target data based on the data in the first storage region when a predetermined first consistency between the compression target data and the data in the first storage region is detected;
   second comparing, by the first processor, the compression target data with data in the second storage region when the predetermined first consistency between the compression target data and the data in the first storage region is not detected, the compression target data being moved to the second storage region after the second comparing; and
   first storing, by the first processor, the compression target data into the first storage region when a predetermined second consistency between the compression target data and the data in the second storage region is detected, wherein
   the first compression code includes position information indicating a position in the first storage region of a data portion longest matching with the compression target data among the data in the first storage region and length information indicating a matching length of the data portion.

8. The method according to claim 7, wherein
   the predetermined first consistency indicates that a data size of longest matching data between the compression target data and the data in the first storage region is greater than a predetermined first size.

9. A method comprising:
   first setting a first storage region and a second storage region in a memory;

first comparing, by a first processor, a compression target data in a file with data in the first storage region;
first creating, by the first processor, a first compression code of the compression target data based on the data in the first storage region when a predetermined first consistency between the compression target data and the data in the first storage region is detected;
second comparing, by the first processor, the compression target data with data in the second storage region when the predetermined first consistency between the compression target data and the data in the first storage region is not detected, the compression target data being moved to the second storage region after the second comparing; and
first storing, by the first processor, the compression target data into the first storage region when a predetermined second consistency between the compression target data and the data in the second storage region is detected, wherein
the first setting sets the second storage region with a first size in the memory, and
the first storing stores the compression target data into the first storage region according to position information indicating a position in the first storage region, the position information being updated according to a size of the compression target data,
the method further comprising:
first changing a size of the second storage region from the first size to a second size smaller than the first size when a total size of data in the first storage region indicated by the position information exceeds a predetermined size.

10. The method according to claim 9, wherein the first changing includes deleting data stored foremost among data stored in the second storage region.

11. The method according to claim 9, wherein the first setting sets the first storage region with a third size in the memory,
the method further comprising:
second changing a size of the first storage region from the third size to a fourth size greater than the third size when the size of the second storage region is changed from the first size to the second size by the first changing.

12. A method comprising:
first setting a first storage region and a second storage region in a memory;
first comparing, by a first processor, a compression target data in a file with data in the first storage region;
first creating, by the first processor, a first compression code of the compression target data based on the data in the first storage region when a predetermined first consistency between the compression target data and the data in the first storage region is detected;
second comparing, by the first processor, the compression target data with data in the second storage region when the predetermined first consistency between the compression target data and the data in the first storage region is not detected, the compression target data being moved to the second storage region after the second comparing; and
first storing, by the first processor, the compression target data into the first storage region when a predetermined second consistency between the compression target data and the data in the second storage region is detected, wherein the first setting sets the first storage region with a third size in the memory,
the first storing includes:
storing the compression target data into the first storage region according to position information indicating a position in the first storage region,
updating the position information according to a size of the stored compression target data, and
controlling update of the position information to store the compression target data within the third size,
the method further comprising:
counting a number of detecting the data in the first storage region that the predetermined first consistency with the compression target data is detected; and
second storing a stored data following the compression target data into the first storage region when the compression target data is overwritten the stored data in the first storage region with the number of detecting exceeds a predetermined number according to the position information.

13. A method of decompressing a compressed file, the method comprising:
reading a compressed data from the compressed file, the compressed file being created based on a first compression code, a second compression code and a third compression code by:
first setting a first storage region and a second storage region in a first memory,
first comparing a compression target data in a file with data in the first storage region,
first creating the first compression code of the compression target data based on the data in the first storage region when a predetermined first consistency between the compression target data and the data in the first storage region is detected,
second comparing the compression target data with data in the second storage region when the predetermined first consistency between the compression target data and the data in the first storage region is not detected, the compression target data being moved to the second storage region after the second comparing,
when a predetermined second consistency between the compression target data and the data in the second storage region is detected, first storing the compression target data into the first storage region and second creating the second compression code of the compression target data based on the data in the second storage region, the first compression code and the second compression code are the same type of code and include an identifier indicating being created based on one of the first comparing and the second comparing, and
third creating the third compression code of the compression target data based on a different type of coding process than a coding process of the first compression code and the second compression code when the predetermined second consistency between the compression target data and the data in the second storage region is not detected based on the second comparing;
fourth creating a first decompression data based on data in a fourth storage region of a second memory according to the first compression code when it is determined that the read compressed data is the first compression code;

fifth creating a second decompression data based on data in a fifth storage region of the second memory according to the second compression code when it is determined that the read compressed data is the second compression code, the fifth storage region being a different storage region from the fourth storage region;

first updating the fourth storage region according to the second compression code and the second decompression data when the second decompression data is created by the fifth creating;

sixth creating a third decompression data from the read compressed data based on a decoding process corresponding to the coding process when it is determined that the read compressed data is the third compression code; and third storing the third decompression data into the fourth storage region.

\* \* \* \* \*